United States Patent
Zhang

(10) Patent No.: US 10,217,832 B2
(45) Date of Patent: Feb. 26, 2019

(54) SEMICONDUCTOR DEVICE

(71) Applicant: FUJI ELECTRIC CO., LTD., Kanagawa (JP)

(72) Inventor: Yanzheng Zhang, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/716,547

(22) Filed: Sep. 27, 2017

(65) Prior Publication Data
US 2018/0102415 A1    Apr. 12, 2018

(30) Foreign Application Priority Data

Oct. 12, 2016    (JP) .................................. 2016-201348

(51) Int. Cl.
| | |
|---|---|
| H01L 29/45 | (2006.01) |
| H01L 21/283 | (2006.01) |
| H01L 29/66 | (2006.01) |
| H01L 29/739 | (2006.01) |
| H01L 29/78 | (2006.01) |

(52) U.S. Cl.
CPC ............ *H01L 29/45* (2013.01); *H01L 21/283* (2013.01); *H01L 29/66333* (2013.01); *H01L 29/66666* (2013.01); *H01L 29/7395* (2013.01); *H01L 29/7827* (2013.01); *H01L 2224/05* (2013.01); *H01L 2224/48463* (2013.01)

(58) Field of Classification Search
CPC ............ H01L 29/7827; H01L 29/66666; H01L 29/45
See application file for complete search history.

(56) References Cited

U.S. PATENT DOCUMENTS

| | | | |
|---|---|---|---|
| 2004/0046266 A1* | 3/2004 | Akamatsu | ......... H01L 21/28518 257/784 |
| 2006/0049406 A1 | 3/2006 | Amaratunga et al. | |
| 2008/0150018 A1 | 6/2008 | Tanabe | |

(Continued)

FOREIGN PATENT DOCUMENTS

| | | |
|---|---|---|
| JP | H06-314722 A | 11/1994 |
| JP | 2000-100816 A | 4/2000 |
| JP | 2007-266483 A | 10/2007 |

(Continued)

OTHER PUBLICATIONS

Office Action issued for counterpart U.S. Appl. No. 15/916,287, dated Jul. 12, 2018.

*Primary Examiner* — Marc Armand

(57) ABSTRACT

A semiconductor device is provided that includes a semiconductor substrate; an insulating film that is provided on the semiconductor substrate, has an opening through which the semiconductor substrate is exposed, and contains oxygen; a first barrier metal portion that is provided at least on a bottom portion of the opening and in which one or more kinds of films are laminated; and an upper electrode provided above the insulating film. The barrier metal is not provided between an upper surface of the insulating film and the upper electrode, or the semiconductor device further comprises a second barrier metal portion between the upper surface of the insulating film and the upper electrode, the second barrier metal portion having a configuration different from that of the first barrier metal portion.

13 Claims, 22 Drawing Sheets

(56) References Cited

U.S. PATENT DOCUMENTS

2013/0001685 A1* 1/2013 Shirakawa .......... H01L 29/1095
  257/335
2013/0313640 A1* 11/2013 Shen ................ H01L 29/66659
  257/336

FOREIGN PATENT DOCUMENTS

| JP | 2008-160039 A | 7/2008 |
| JP | 2011-249491 A | 12/2011 |

* cited by examiner

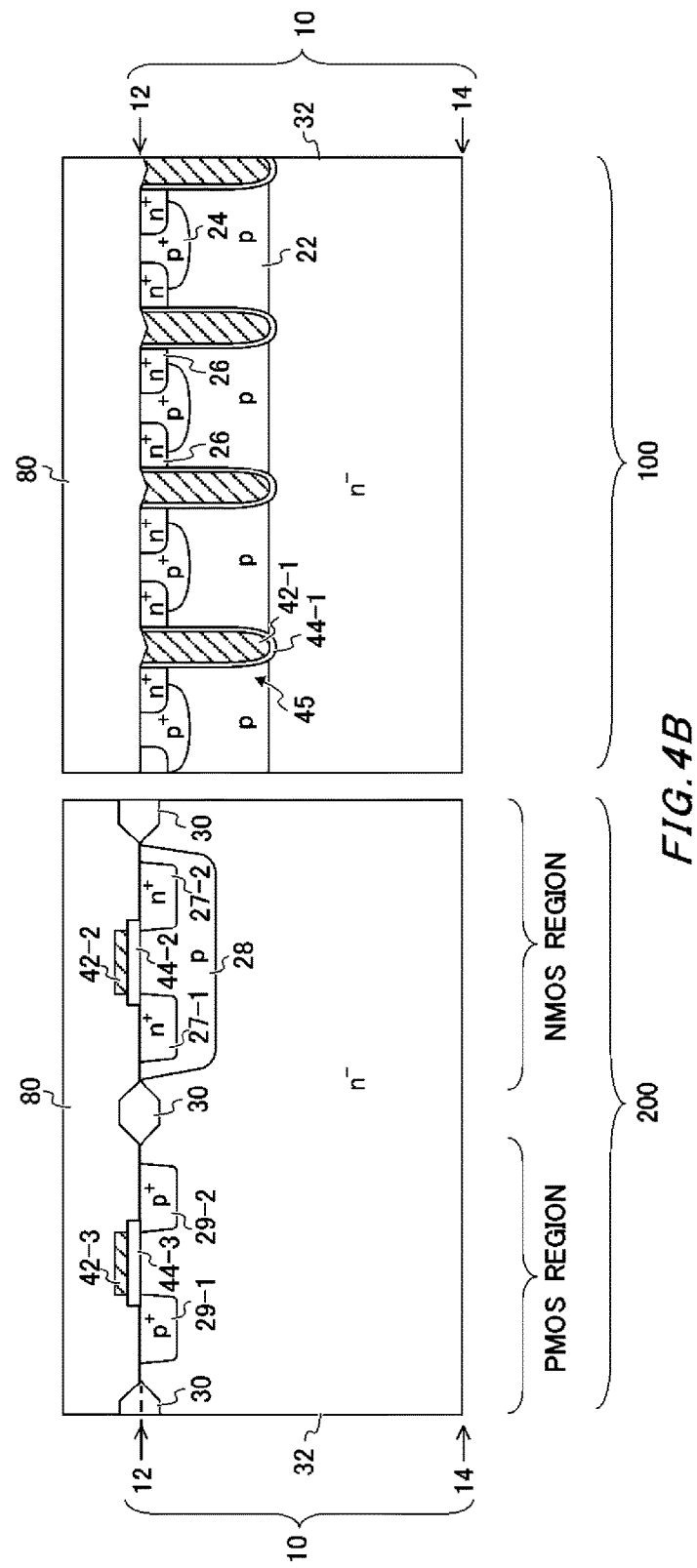

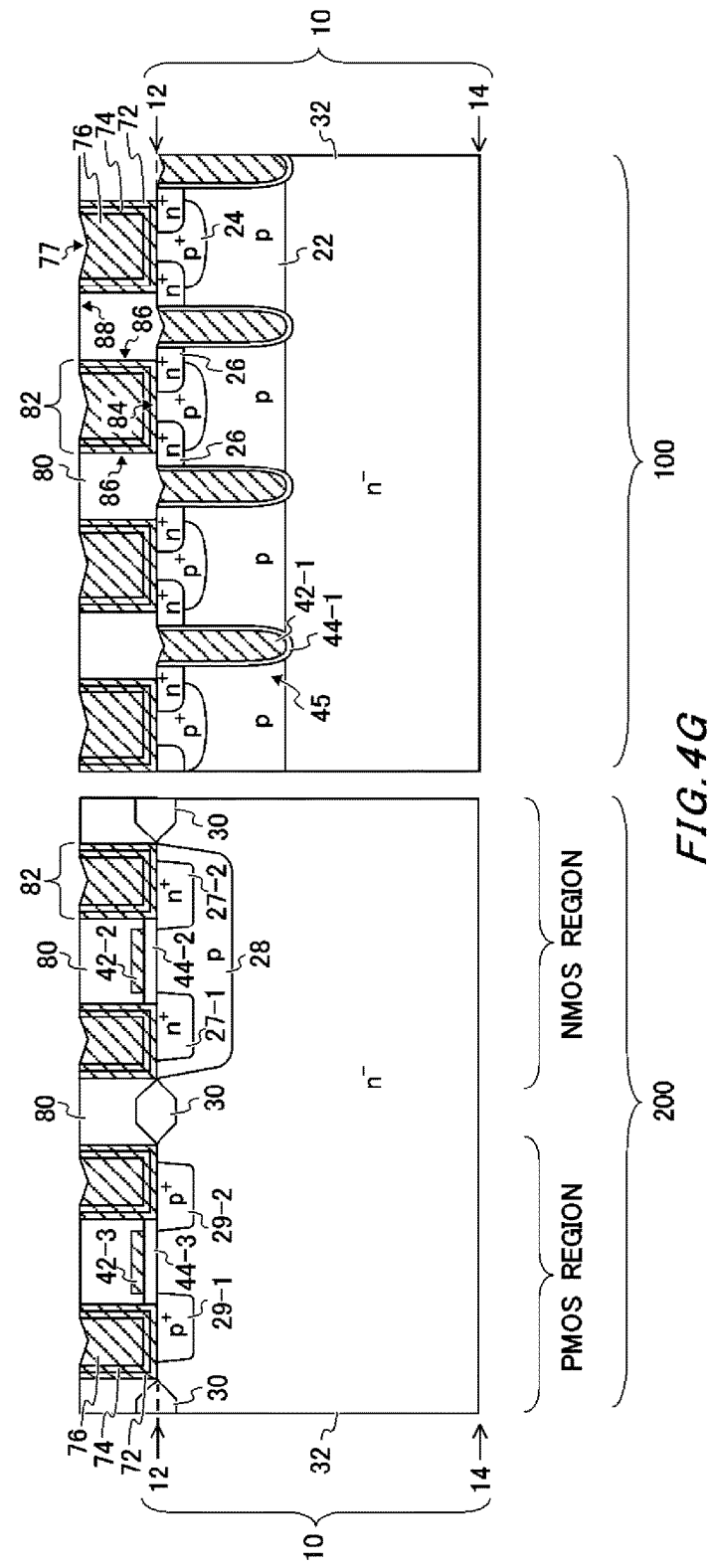

SEMICONDUCTOR DEVICE

The contents of the following Japanese patent application are incorporated herein by reference:
NO. 2016-201348 filed in JP on Oct. 12, 2016.

BACKGROUND

Technical Field

The present invention relates to semiconductor devices.

Conventionally, a so-called barrier metal or a high-melting point metal has been used in a source contact portion of a MOSFET (Metal Oxide Semiconductor Field Effect Transistor) and in an emitter contact portion of an IGBT (Insulated Gate Bipolar Transistor) (See Patent Documents 1 to 3, for example).

Related Art

Patent Documents

Patent Document 1: Japanese Patent Application Publication No. 2008-160039
Patent Document 2: Japanese Patent Application Publication No. 2007-266483
Patent Document 3: Japanese Patent Application Publication No. 2011-249491

As a source electrode or an emitter electrode, aluminum (hereinafter referred to as Al) containing metal is used in some cases. Also, as a barrier metal film that prevents reaction between the Al containing metal and a silicon (hereinafter referred to as Si) substrate, a titanium (hereinafter referred to as Ti) film is used in some cases. However, in a case where a Ti film is provided on an interlayer insulating film formed of BPSG or the like, the Ti film absorbs oxygen contained in the interlayer insulating film and thereby the Ti film changes into a titanium oxide (hereinafter referred to as $TiO_2$) film. Because of this, adhesiveness between the $TiO_2$ film and the interlayer insulating film is lowered. Thus, a source electrode or an emitter electrode gets peeled off from the interlayer insulating film, thereby lowering the reliability of the semiconductor device.

SUMMARY

In the first aspect of the present invention, a semiconductor device is provided. The semiconductor device may include a semiconductor substrate, an insulating film, a first barrier metal portion, and an upper electrode. The insulating film may be provided on the semiconductor substrate. The insulating film may have an opening through which the semiconductor substrate is exposed. The insulating film may contain oxygen. The first barrier metal portion may be provided at least on a bottom of the opening. The first barrier metal portion may be provided to have one or more kinds of films being laminated. The upper electrode may be provided above the insulating film. A barrier metal may not be provided between an upper surface of the insulating film and the upper electrode. Or, alternatively, the semiconductor device may further include a second barrier metal portion between the upper surface of the insulating film and the upper electrode, the second barrier metal portion having the configuration different from that of the first barrier metal portion.

In the second barrier metal portion, a film that contacts the insulating film may be neither a titanium film nor a titanium oxide film.

The first barrier metal portion may have a laminated film. The laminated film may be a titanium film and a titanium nitride film on the titanium film. Also, the second barrier metal portion may have a titanium nitride film.

The semiconductor device may further include a plug in the opening in the insulating film. The plug may have tungsten.

The second barrier metal portion may be provided also between the plug and the upper electrode.

The second barrier metal portion between the upper surface of the insulating film and the upper electrode and the second barrier metal portion between an upper surface of the plug and the upper electrode may be continuous.

Material of the upper electrode may contain silicon.

A power element unit and a control circuit unit may be provided on the semiconductor substrate. The power element unit may have at least the insulating film, the first barrier metal portion, the second barrier metal portion, and the upper electrode. The control circuit unit may control the power element unit.

The semiconductor device may further include a copper wire. The copper wire may be electrically connected to the upper electrode on the upper electrode.

In the second aspect of the present invention, a semiconductor device manufacturing method is provided. The semiconductor device manufacturing method may include forming an insulating film, forming an opening in the insulating film, forming a first barrier metal portion, and forming an upper electrode. The insulating film may be provided on the semiconductor substrate. The insulating film may contain oxygen. The opening in the insulating film may expose the semiconductor substrate. The first barrier metal portion may be provided at least on the bottom of the opening. The first barrier metal portion may be provided to have one or more kinds of films being laminated. The upper electrode may be provided above the insulating film. In the semiconductor device manufacturing method, a barrier metal may not be formed between an upper surface of the insulating film and the upper electrode. Or, alternatively, the semiconductor device manufacturing method may further include providing a second barrier metal portion between the upper surface of the insulating film and the upper electrode, the second barrier metal portion having the configuration different from that of the first barrier metal portion.

The semiconductor device manufacturing method may further include forming a plug after forming the first barrier metal portion and before forming the upper electrode. The plug may be provided in the opening in the insulating film. The plug may have tungsten.

The summary clause does not necessarily describe all necessary features of the embodiments of the present invention. The present invention may also be a sub-combination of the features described above.

BRIEF DESCRIPTION OF THE DRAWINGS

FIG. 4B is a cross-sectional view in step S20.

FIG. 4G is a cross-sectional view in step S45.

DESCRIPTION OF EXEMPLARY EMBODIMENTS

Hereinafter, (some) embodiment(s) of the present invention will be described. The embodiment(s) do(es) not limit the invention according to the claims. Also, all the combinations of the features described in the embodiment(s) are not necessarily essential to means provided by aspects of the invention.

Figure 1:
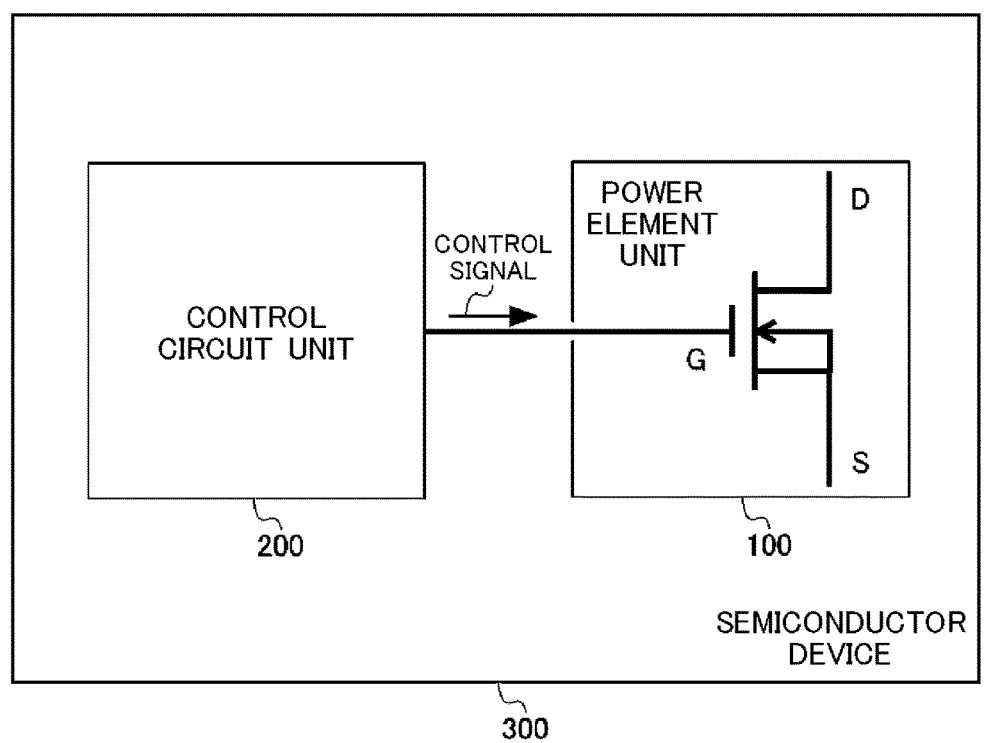
FIG. 1 is a schematic view showing a semiconductor device 300.

FIG. 1 is a schematic view showing a semiconductor device 300. The semiconductor device 300 of the present example has a power element unit 100 and a control circuit unit 200. The semiconductor device 300 of the present example is a so-called intelligent power switch, in which the power element unit 100 and the control circuit unit 200 are integrated on one semiconductor substrate. By providing the power element unit 100 and the control circuit unit 200 on one semiconductor substrate, the semiconductor device 300 can be scaled down compared to a case where the power element unit 100 and the control circuit unit 200 are respectively provided on different chips.

The power element unit 100 of the present example has a function to pass a large current from a drain (D) to a source (S). The control circuit unit 200 has a function to control operation of the power element unit 100. The control circuit unit 200 of the present example has a function to control ON and OFF of a gate (G) of the power element unit 100 by sending a control signal to the power element unit 100. For example, the control circuit unit 200 has a logic circuit, a level shift circuit, and a driver circuit. Also, the control circuit unit 200 may have a function to detect abnormality in the power element unit 100. For example, the control circuit unit 200 has a overheat detecting function, an overcurrent detecting function, an overvoltage detecting function, a short circuit detecting function, and a protection circuit function. Because of this, the operation reliability of the power element unit 100 can be increased.

Figure 2:
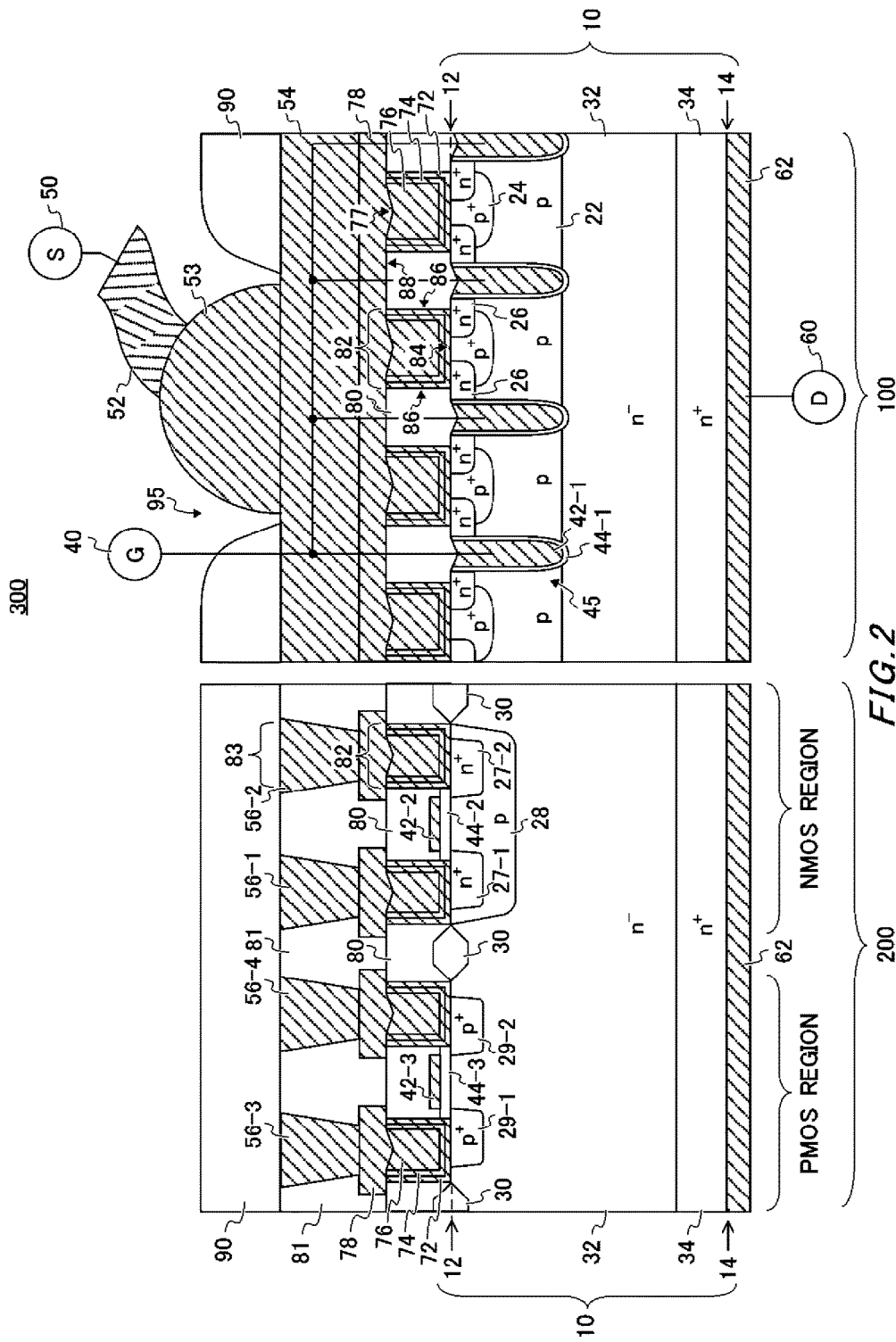
FIG. 2 is a cross-sectional view of the semiconductor device 300 in the first embodiment.

FIG. 2 is a cross-sectional view of the semiconductor device 300 in the first embodiment. FIG. 2 shows part of cross sections of the power element unit 100 and the control circuit unit 200. As described above, the power element unit 100 and the control circuit unit 200 are provided on a shared semiconductor substrate 10.

The power element unit 100 of the present example is a trench gate type vertical MOSFET. The power element unit 100 of the present example has the semiconductor substrate 10, a gate electrode 42-1, a gate insulating film 44-1, an upper electrode 54, a drain electrode 62, a Ti film 72, a titanium nitride (hereinafter referred to as TiN) film 74, a tungsten (hereinafter referred to as W) plug 76, a TiN film 78, an insulating film 80, and a passivation film 90. Also, in the present example, a solder 53 and a wire 52 are provided in an opening 95 in the passivation film 90. The power element unit 100 of the present example is a trench gate type vertical MOSFET but may also be a planar gate type vertical MOSFET.

The semiconductor substrate 10 of the present example is a Si substrate. Note that the semiconductor substrate 10 in another example may also be a compound semiconductor substrate such as a silicon carbide (SiC) semiconductor substrate or the like. In the present example, one principal surface of the semiconductor substrate 10 is referred to as a front surface 12, and another principal surface opposite to the principal surface is referred to as a back surface 14. Note that in the present example, the direction from the back surface 14 to the front surface 12 is referred to as the "upward" direction and the opposite direction is referred to as the "downward" direction for convenience.

The semiconductor substrate 10 of the present example has a drain region 34 on the back surface 14 side. The drain region 34 has a predetermined thickness in the upper direction from the back surface 14. The drain region 34 of the present example is an $n^+$-type region. In the present example, n and p respectively refer to a state in which electrons are the majority carrier and a state in which holes are the majority carrier. Also, the + and – signs written to the upper right of n and p respectively mean that the carrier concentration is higher than in a case where a + sign is not written and that the carrier concentration is lower than in a case where a – sign is not written.

The semiconductor substrate 10 of the present example has a drift region 32 on the drain region 34. The drift region 32 has a predetermined thickness in the upper direction from the boundary with the drain region 34. The drift region 32 of the present example is provided from the boundary with the drain region 34 to a base region 22. The drift region 32 of the present example is an $n^-$-type region.

The semiconductor substrate 10 of the present example has the base region 22 on the drift region 32. The base region 22 has a predetermined thickness in the lower direction from the front surface 12. The base region 22 of the present example is provided from the front surface 12 to the boundary facing the drift region 32. The base region 22 of the present example is a p-type region.

The semiconductor substrate 10 of the present example has a trench portion 45. The trench portion 45 has a trench provided in the semiconductor substrate 10, and the gate electrode 42-1 and the gate insulating film 44-1 embedded in the trench. The trench of the present example reaches the drift region 32, extending from the front surface 12 via the base region 22. The gate insulating film 44-1 of the present example directly contacts a bottom and a side portion of the trench. The gate insulating film 44-1 may have silicon dioxide (hereinafter referred to as $SiO_2$). The gate electrode 42-1 of the present example directly contacts the gate insulating film 44-1. The gate electrode 42-1 may have polysilicon.

The semiconductor substrate 10 of the present example has a source region 26. At least part of the source region 26 is exposed to the front surface 12. The source region 26 may provide a conduct path having low resistance to electron current flowing through the MOSFET. The source region 26 of the present example is an n+-type region. The source regions 26 may be provided to surround the trench portion 45. In FIG. 2, a pair of the source regions 26 is provided so as to directly contact side portions of the trench portion 45 and surround the trench portion 45. Note that the source region 26 may annularly surround the trench portion 45 in a case where the trench portion 45 is provided in a stripe shape in the direction perpendicular to the sheet.

The semiconductor substrate 10 of the present example has a contact region 24. At least part of the contact region 24 is exposed to the front surface 12. Compared to an intrinsic semiconductor and an n-type impurity region, the contact region 24 may provide lower contact resistance to metal. The contact region 24 of the present example is a p+-type region. The contact region 24 of the present example is provided between a pair of the source regions 26.

The insulating film 80 may be provided on the trench portion 45 of the semiconductor substrate 10. The insulating film 80 of the present example has an opening 82 that exposes the contact region 24 and the source region 26. The insulating film 80 of the present example is BPSG (Borophospho Silicate Glass). The constituent elements of BPSG are boron (B), phosphorus (P), silicon (Si), and oxygen (O). That is, the insulating film 80 of the present example contains oxygen (O).

Note that the insulating film 80 may also be BSG (borosilicate glass) or PSG (phosphosilicate glass). The constituent elements of BSG are B, Si, and O. Also, the constituent elements of PSG are P, Si, and O. Both contain oxygen (O) in the constituent elements.

In the opening 82 in the insulating film 80, a first barrier metal portion in which one or more kinds of films are laminated is provided. In the present example, the first barrier metal portion has a laminated film of the Ti film 72 and the TiN film 74. The Ti film 72 and the TiN film 74 may be conformally provided in the opening 82 in the insulating film 80.

The Ti film 72 of the present example is provided so as to directly contact a bottom portion 84 of the opening 82 (that is, the front surface 12) and a side portion of the opening 82 (that is, a side surface 86 of the insulating film 80). In addition, the TiN film 74 of the present example directly contacts the Ti film 72 provided on the bottom portion 84. Furthermore, the TiN film 74 of the present example directly contacts the surface of the Ti film 72, the surface being opposite to the side surface 86 of the insulating film 80. However, the first barrier metal portion of the present example is not provided on an upper surface 88 of the insulating film 80.

In the opening 82 in the insulating film 80, the W-plug 76 is provided in addition to the first barrier metal portion. The W-plug 76 directly contacts the TiN film 74. That is, the opening 82 in the insulating film 80 is filled with the Ti film 72, the TiN film 74, and the W-plug 76.

The opening 82 in the insulating film 80 may be provided so as to correspond to the shape of the contact region 24 seen from above. In a case where the contact region 24 has a stripe shape when seen from above, the opening 82 may also have a stripe shape when seen from above. Also, in a case where the contact region 24 has a dot shape when seen from above, the opening 82 may also have a dot shape when seen from above. Needless to say, the first barrier metal portion and the W-plug 76 may be provided so as to correspond to the shape of the opening 82.

In the present example, the TiN film 78 as a second barrier metal portion directly contacts the upper surface 88 of the insulating film 80 and upper portions of the first barrier metal portion and the W-plug 76. The upper electrode 54 directly contacts the TiN film 78 on the TiN film 78. The upper electrode 54 may be an alloy containing Al as the main component, such as an Al—Si alloy or an alloy containing Cu as the main component. The upper electrode 54 of the present example is an Al—Si—Cu alloy (note that Cu means the element symbol of copper).

The Ti film 72 of the first barrier metal portion, for example, may have a function to prevent Al in the upper electrode 54 and Si in the semiconductor substrate 10 from reacting with each other. Also, compared to a case where the first barrier metal portion is a single film of the TiN film 74, the Ti film 72 may have a function to reduce contact resistance between the contact region 24 and the source region 26.

The TiN film 74 in the first barrier metal portion and the TiN film 78 in the second barrier metal portion, for example, have a function to prevent electromigration (hereinafter referred to as EM), which is that metal atoms (Al, Si, or Cu in the present example) in the upper electrode 54 move downwardly due to passing current to metal wires such as the upper electrode 54. In the present example, by providing the TiN film 78 between the W-plug 76 and the upper electrode 54, EM from the upper electrode 54 to the W-plug 76 can be prevented.

In the present example, the TiN film 78 is also provided between the upper surface 88 of the insulating film 80 and the upper electrode 54. This can prevent deformation of the insulating film 80 due to temperature cycles at the operation time of the semiconductor device 300. Note that in a case where the material of the upper electrode 54 contains Si, the Si particles pushed out by stress in bonding wires generate a crack in the insulating film 80 in some cases. However, in the present example, the TiN film 78 having a greater hardness than the insulating film 80 covers the insulating film 80, and therefore occurrence of the crack in the insulating film 80 can be prevented. This can increase operation reliability of the semiconductor device 300.

The TiN film 78 between the upper surface 88 of the insulating film 80 and the upper electrode 54 and the TiN film 78 between an upper surface 77 of the W-plug 76 and the upper electrode 54 may be continuous. The TiN film 78 of the present example is continuous in the entire power element unit 100. This can prevent EM more certainly than a case where the TiN film 78 is discontinuous on the insulating film 80, thereby increasing the operation reliability.

In the present example, the second barrier metal portion is a single film of the TiN film 78. This is different from the configuration of the first barrier metal portion, which is a laminated film of the Ti film 72 and the TiN film 74. In the present example, the Ti film 72 is not provided on the upper surface 88 of the insulating film 80 containing O atoms, and therefore the $TiO_2$ layer is not produced on the insulating film 80. Thus, the structure on the insulating film 80 can be prevented from getting peeled off. This can increase operation reliability of the semiconductor device 300 compared to a case where the Ti film 72 is provided on the insulating film 80.

Note that the second barrier metal portion may not be a single film of the TiN film 78. The second barrier metal portion may be a laminated film of a plurality of films. Also, the second barrier metal portion may not be a continuous film. However, in the second barrier metal portion, the film that directly contacts the insulating film 80 is neither the Ti film nor the $TiO_2$ film. Thus, the $TiO_2$ layer is not produced on the insulating film 80, thereby preventing the upper electrode 54 from getting peeled off from the insulating film 80. This increases operation reliability of the semiconductor device 300.

The passivation film 90 is provided on the upper electrode 54. The passivation film 90 has an opening 95 for electrically connecting the solder 53 and the upper electrode 54. The wire 52 may be electrically connected to the upper electrode 54 via the solder 53. The wire 52 may be a gold (Au) wire or a Cu wire. Also, the wire 52 may also be an Al wire, an alloy wire containing Al, or an alloy wire containing Cu.

The circled G is a gate portion 40 and corresponds to G in FIG. 1. Similarly, the circled S and the circled D are a source portion 50 and a drain portion 60, respectively. The source portion 50 and the drain portion 60 correspond to S and D in FIG. 1, respectively.

The control circuit unit 200 of the present example is a planar gate type lateral MOSFET. The control circuit unit 200 of the present example has the semiconductor substrate 10, gate electrodes 42-2 and 42-3, gate insulating films 44-2 and 44-3, a wiring layer 56, the drain electrode 62, the Ti film 72, the TiN film 74, the W-plug 76, the TiN film 78, the insulating film 80, an insulating film 81, and the passivation film 90. The control circuit unit 200 and the power element unit 100 are electrically isolated from each other by an isolating region 30 provided on the front surface 12 of the semiconductor substrate 10. For the control circuit unit 200, description is omitted regarding the same constituents as those of the power element unit 100.

The control circuit unit 200 of the present example has at least an NMOS region and a PMOS region. The NMOS region and the PMOS region are part of the control circuit unit 200. The NMOS region and the PMOS region of the present example are electrically isolated from each other with the isolating region 30 located therebetween.

The semiconductor substrate 10 in the NMOS region has an $n^+$-type well region 27 and a p-type well region 28. The $n^+$-type well region 27 and the p-type well region 28 are each exposed to the front surface 12. Two $n^+$-type well regions 27 are provided to be separate from each other in the p-type well region 28. Of the two $n^+$-type well regions 27, one functions as a source region, and the other functions as a drain region. The p-type well region 28 that is between the two $n^+$-type well regions 27 and is below the gate electrode 42-2 functions as a channel-forming region.

The semiconductor substrate 10 in the PMOS region has a $p^+$-type well region 29. The $p^+$-type well region 29 is exposed to the front surface 12. In the $n^-$-type drift region 32, two $p^+$-type well regions 29 are provided to be separate from each other. Of the two $p^+$-type well regions 29, one functions as a source region, and the other functions as a drain region. The $n^-$-type drift region 32 that is between the two $p^+$-type well regions 29 and is below the gate electrode 42-3 functions as a channel-forming region.

The control circuit unit 200 may be driven by receiving an input signal (IN) from the outside. The gate insulating film 44-2 is provided between the front surface 12 and the gate electrode 42-2, and the gate insulating film 44-3 is provided between the front surface 12 and the gate electrode 42-3. The insulating film 80 is provided so as to directly contact the gate electrodes 42-2 and 42-3. The insulating film 80 is also provided on the isolating region 30. The insulating film 80 has the opening 82 for connecting the first barrier metal portion (the Ti film 72 and the TiN film 74) and the W-plug 76 to the source region and the drain region. Also with the control circuit unit 200, the same advantageous effect as that with the first barrier metal portion in the power element unit 100 can be achieved.

In the present example, the shape of the second barrier metal portion (the TiN film 78) in the control circuit unit 200 is different from that of the TiN film 78 in the power element unit 100. The TiN films 78 in the control circuit unit 200 are electrically isolated between the source and the drain in order to prevent short circuit between the source and the drain. The TiN films 78 of the present example are isolated above the gate electrodes 42-2 and 42-3.

In the control circuit unit 200, current flows in the direction parallel to the front surface 12 of the semiconductor substrate 10. That is, in the control circuit unit 200, main current does not flow in the vertical direction (upper/lower direction) but flows in the horizontal direction (the direction perpendicular to the upper/lower direction). In the present example, main current that flows in the horizontal direction is referred to as lateral current. In the present example, it is possible that EM, which is that metal atoms in the wiring layer 56 move due to lateral current flowing in the wiring layer 56 inside the control circuit unit 200, is generated, and thereby disconnection is generated in the wiring layer 56 inside the control circuit unit 200. Note that in the present example, the material of the wiring layer 56 is the same as that of the upper electrode 54. However, the power element unit 100 of the present example has the TiN film 78 that is continuous, and therefore the structure located lower than the TiN film 78 can be protected from the adverse effect of EM.

On the TiN film 78 and the insulating film 80, the insulating film 81 is further provided. The insulating film 81 has a plurality of openings 83. The wiring layer 56 having the same material as that of the upper electrode 54 is embedded in each of the plurality of the openings 83. The wiring layers 56-1 and 56-3 are connected to the $n^+$-type well region 27-1 and the $p^+$-type well region 29-1, respectively. Also, the wiring layers 56-2 and 56-4 are connected to the $n^+$-type well region 27-2 and the $p^+$-type well region 29-2, respectively. The passivation film 90 is provided on the wiring layer 56 and the insulating film 81.

Figure 3:
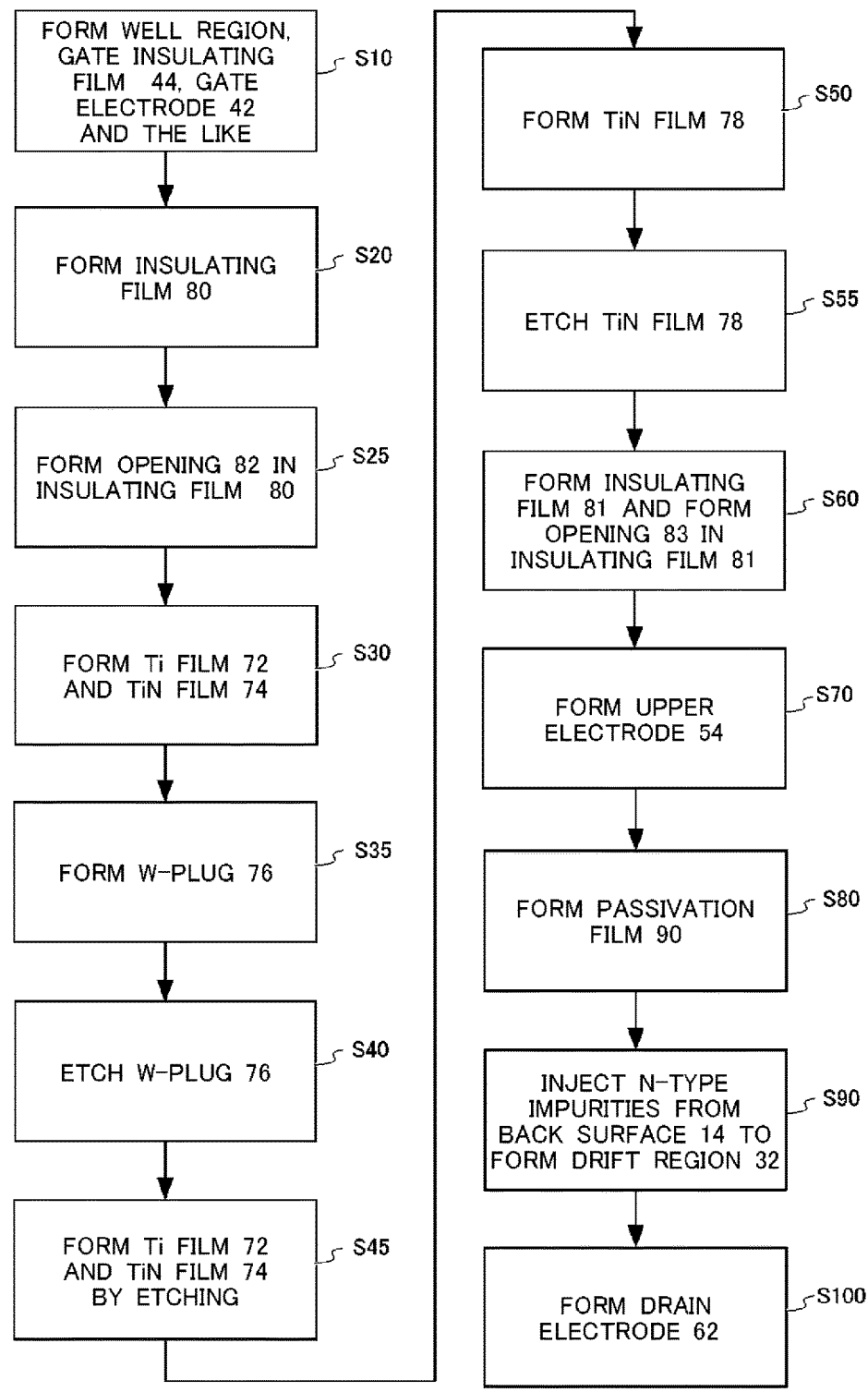
FIG. 3 is a flow chart showing a procedure of manufacturing the semiconductor device 300.

FIG. 3 is a flow chart showing a procedure of manufacturing the semiconductor device 300. In the present example, respective steps are performed in the order of S10 to S100. The manufacturing method of the semiconductor device 300 of the present example includes a step of forming an impurity injection region, the gate electrode 42, the gate insulating film 44, and the like (S10), a step of forming the insulating film 80 (S20), a step of forming the opening 82 in the insulating film 80 (S25), a step of forming the first barrier metal portion (S30), a step of forming the W-plug 76 (S35), a step of etching the W-plug 76 (S40), a step of etching the first barrier metal portion (the Ti film 72 and the TiN film 74) (S45), a step of forming the second barrier metal portion (S50), a step of etching the second barrier metal portion (S55), a step of forming the insulating film 81 and forming the opening 83 in the insulating film 81 (S60), a step of forming the upper electrode 54 and the wiring layer 56 (S70), a step of forming the passivation film 90 (S80), a step of forming the drift region 32 by ion implantation (S90), and a step of forming the drain electrode 62 (S100).

Figure 4A:
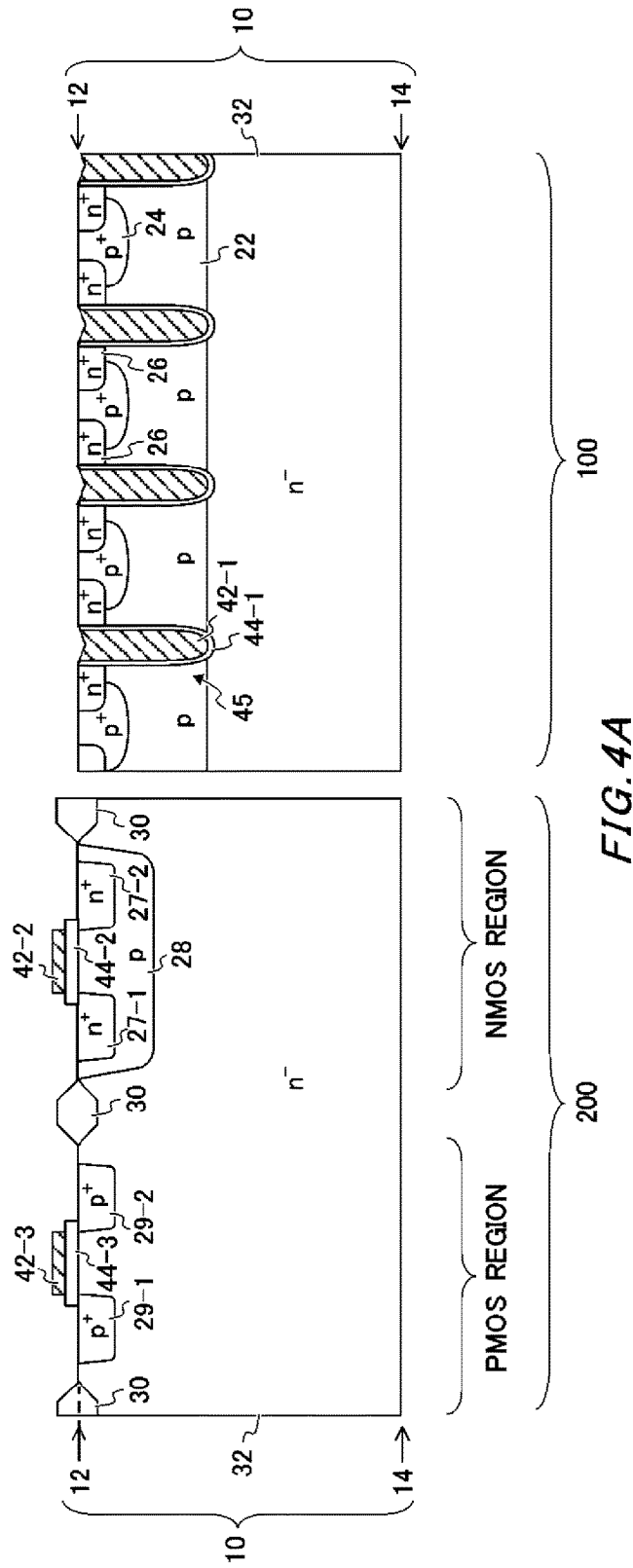
FIG. 4A is a cross-sectional view in step S10.

FIG. 4A is a cross-sectional view in step S10. In step S10, the isolating region 30 is formed by oxidization. Then, p-type impurities are ion-implanted into the semiconductor substrate 10. Then, n-type and p-type impurities are selectively ion-implanted into the semiconductor substrate 10. Subsequently, the semiconductor substrate 10 is thermally annealed. Thereby, the p-type base region 22, the p-type well region 28, the $n^+$-type source region 26, the $p^+$-type contact region 24, the $n^+$-type well region 27, and the $p^+$-type well region 29 are formed. Then, the gate insulating film 44 (i.e., 44-1, 44-2, 44-3) and the gate electrode 42 (i.e., 42-1, 42-2, 42-3) are formed.

FIG. 4B is a cross-sectional view in step S20. In step S20, the insulating film 80 is formed on the semiconductor substrate 10 by CVD (chemical vapor deposition). The insulating film 80 of the present example is BPSG.

Figure 4C:
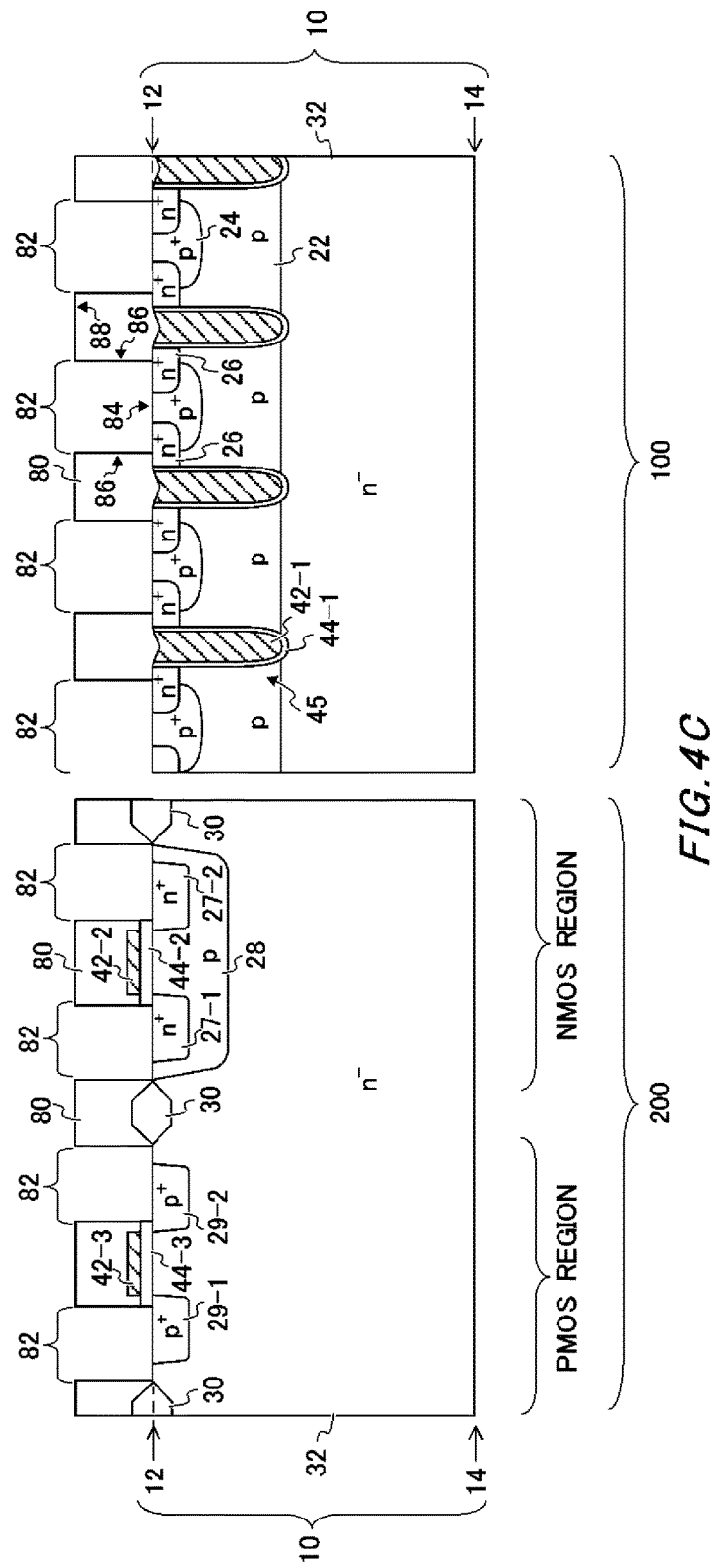
FIG. 4C is a cross-sectional view in step S25.

FIG. 4C is a cross-sectional view in step S25. In step S25, by etching the insulating film 80, the opening 82 is formed in the insulating film 80. The source region 26, the contact region 24, the $n^+$-type well region 27, and the $p^+$-type well region 29 in the semiconductor substrate 10 are exposed through the openings 82 in the insulating film 80. For etching, known photolithography and etching steps may be used.

Figure 4D:
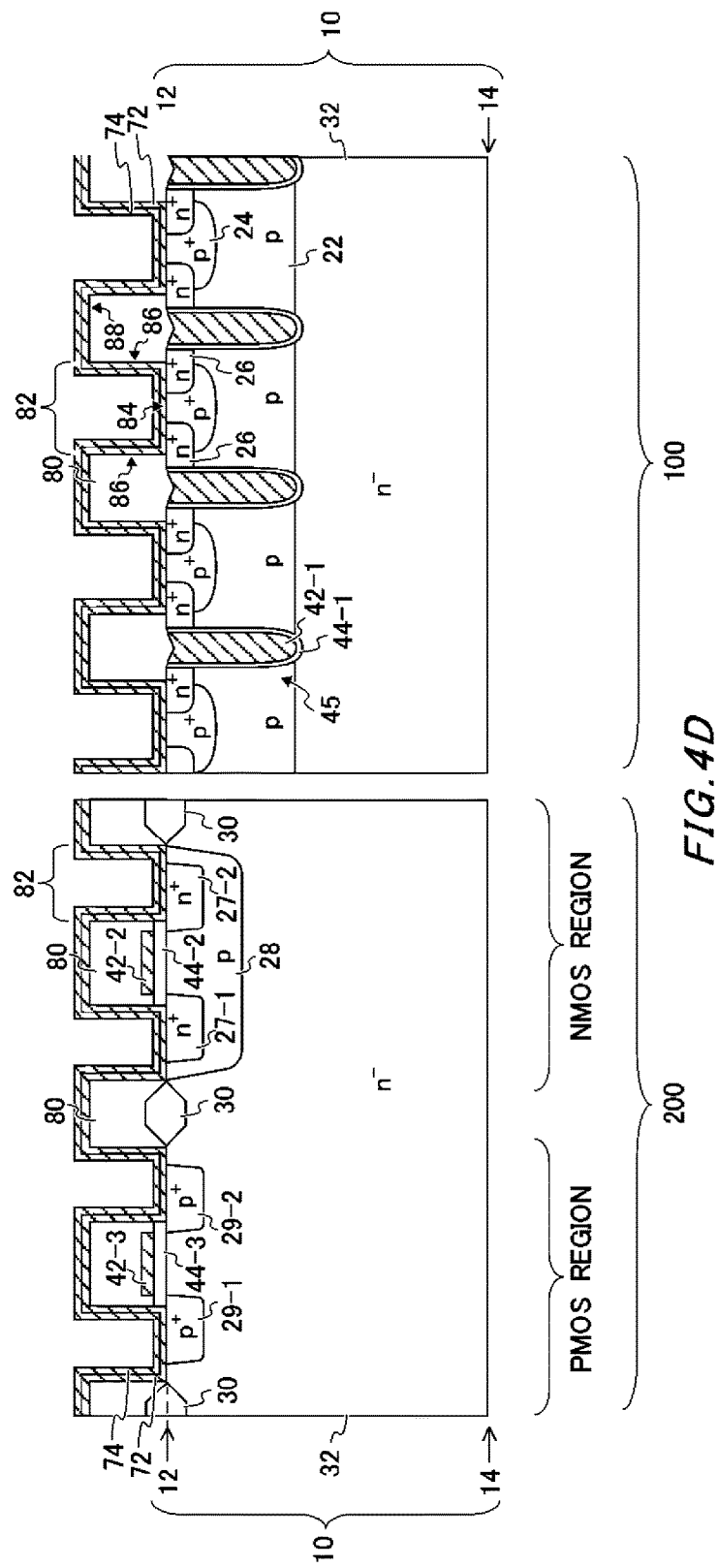
FIG. 4D is a cross-sectional view in step S30.

FIG. 4D is a cross-sectional view in step S30. In step S30, by sputtering, the first barrier metal portion is formed on the bottom portion 84 of the opening 82, and on the side surface 86 and the upper surface 88 of the insulating film 80. In the present example, the Ti film 72 and the TiN film 74 are sequentially subject to sputtering. In the present example, the first barrier metal portion is formed over the entire upper surfaces of the power element unit 100 and the control circuit unit 200.

Figure 4E:
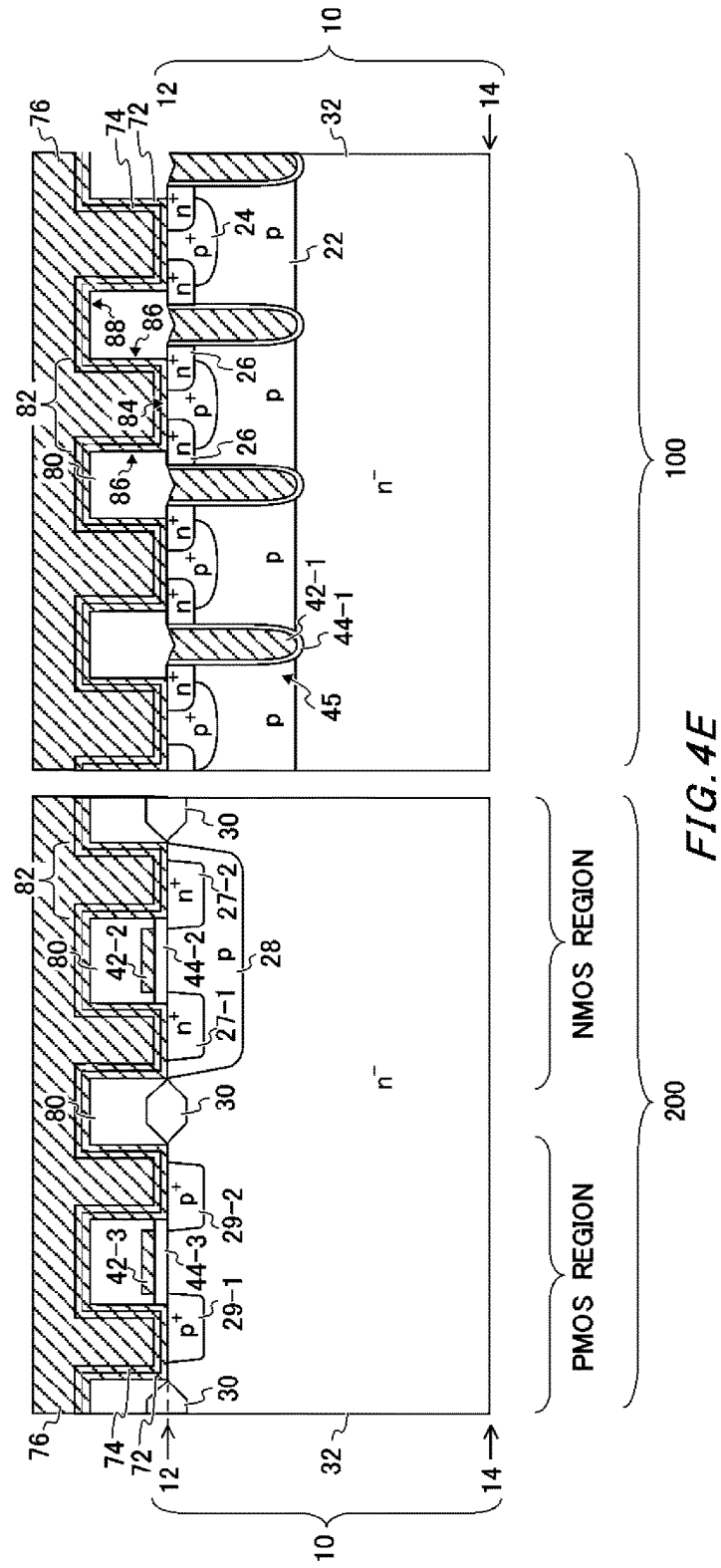
FIG. 4E is a cross-sectional view in step S35.

FIG. 4E is a cross-sectional view in step S35. In step S35, by sputtering, W is formed over the entire upper surfaces of the first barrier metal portions in the power element unit 100 and the control circuit unit 200. W is embedded in the opening 82 in the insulating film 80 with the first barrier metal portion interposed therebetween.

Figure 4F:
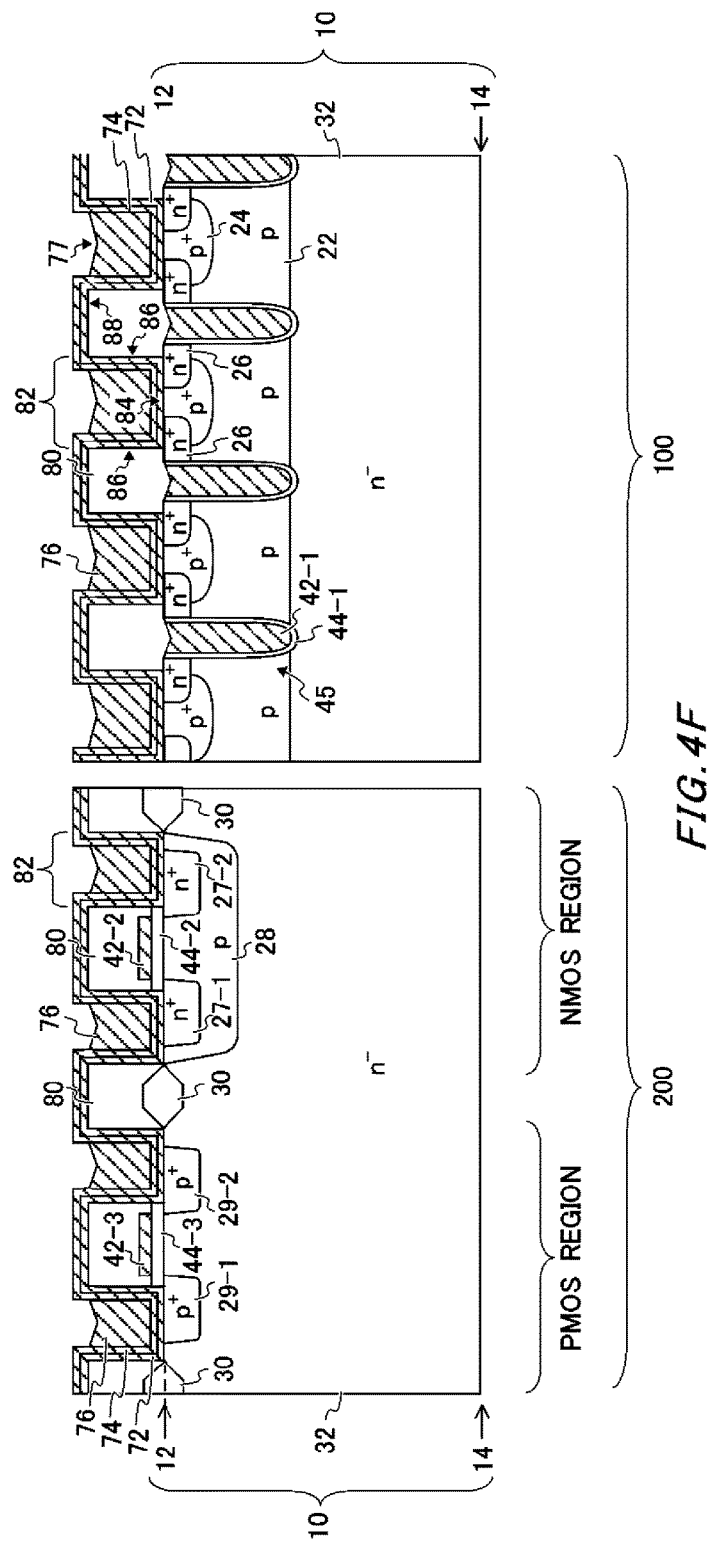
FIG. 4F is a cross-sectional view in step S40.

FIG. 4F is a cross-sectional view in step S40. In step S40, by selectively etching W, W located at the first barrier metal portion on the upper surface 88 of the insulating film 80 can be removed. This leaves the W-plug 76 only in the opening 82. Note that the etching causes the upper portion of the W-plug 76 to have a downwardly-recessed shape.

FIG. 4G is a cross-sectional view in step S45. In step S45, by etching, only the Ti film 72 and the TiN film 74 that are located on the upper surface 88 of the insulating film 80 are selectively removed. This leaves the Ti film 72 and the TiN film 74 on the bottom portion 84 and the side surface 86 of the opening 82 in the insulating film 80.

Figure 4H:
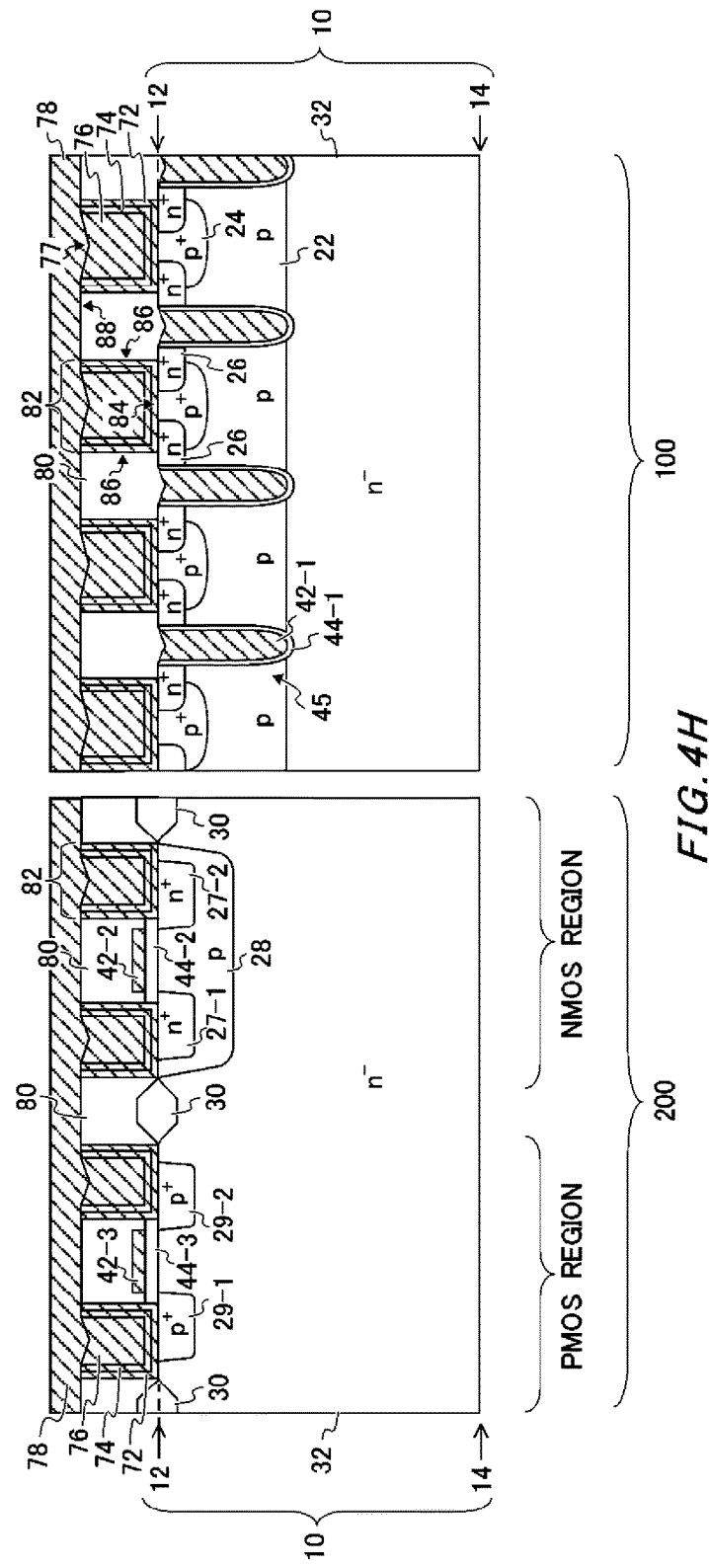
FIG. 4H is a cross-sectional view in step S50.

FIG. 4H is a cross-sectional view in step S50. In step S50, by sputtering, the second barrier metal portion is formed over the entire upper surfaces of the power element unit 100 and the control circuit unit 200. As described above, the second barrier metal portion is the TiN film 78.

Figure 4I:
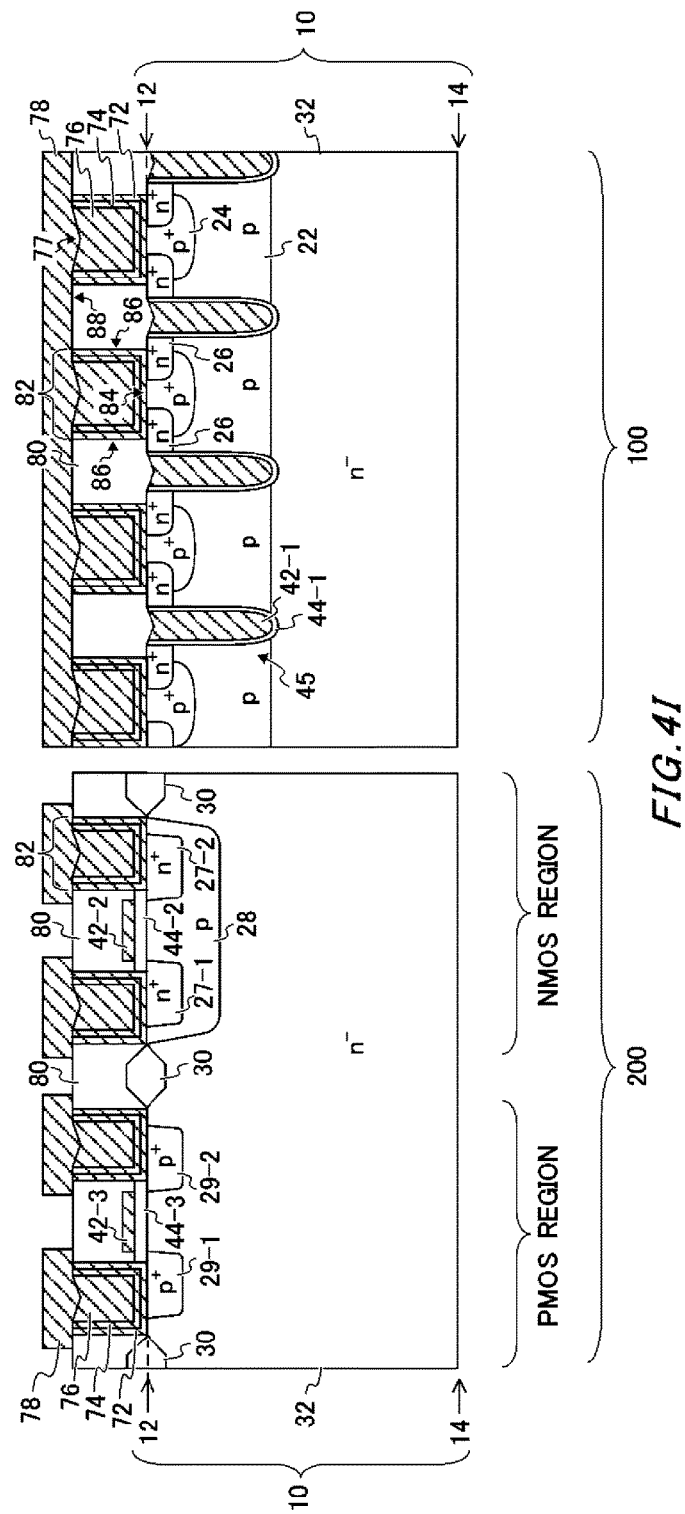
FIG. 4I is a cross-sectional view in step S55.

FIG. 4I is a cross-sectional view in step S55. In step S55, the TiN film 78 in the control circuit unit 200 is selectively removed. This electrically isolates the source region and the drain region in the control circuit unit 200. Note that the TiN film 78 in the power element unit 100 is not subject to etching.

Figure 4J:
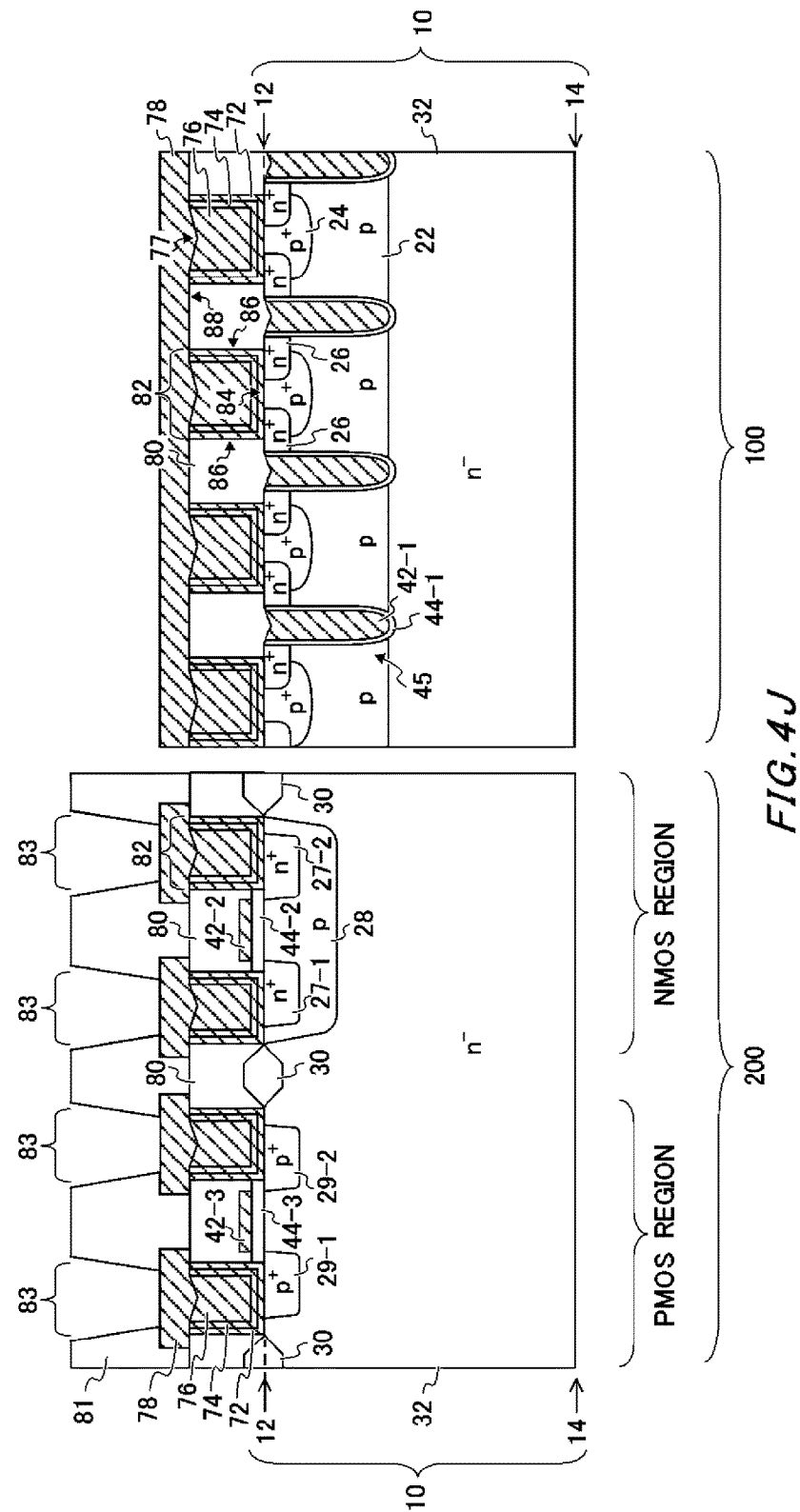
FIG. 4J is a cross-sectional view in step S60.

FIG. 4J is a cross-sectional view in step S60. In step S60, the insulating film 81 having the opening 83 is formed only in the control circuit unit 200. For example, first, by CVD, the insulating film 81 is formed over the entire upper surfaces of the power element unit 100 and the control circuit unit 200. Then, the insulating film 81 on the entire upper surface of the power element unit 100 and the insulating film 81 on the TiN film 78 in the control circuit unit 200 are removed by etching.

Figure 4K:
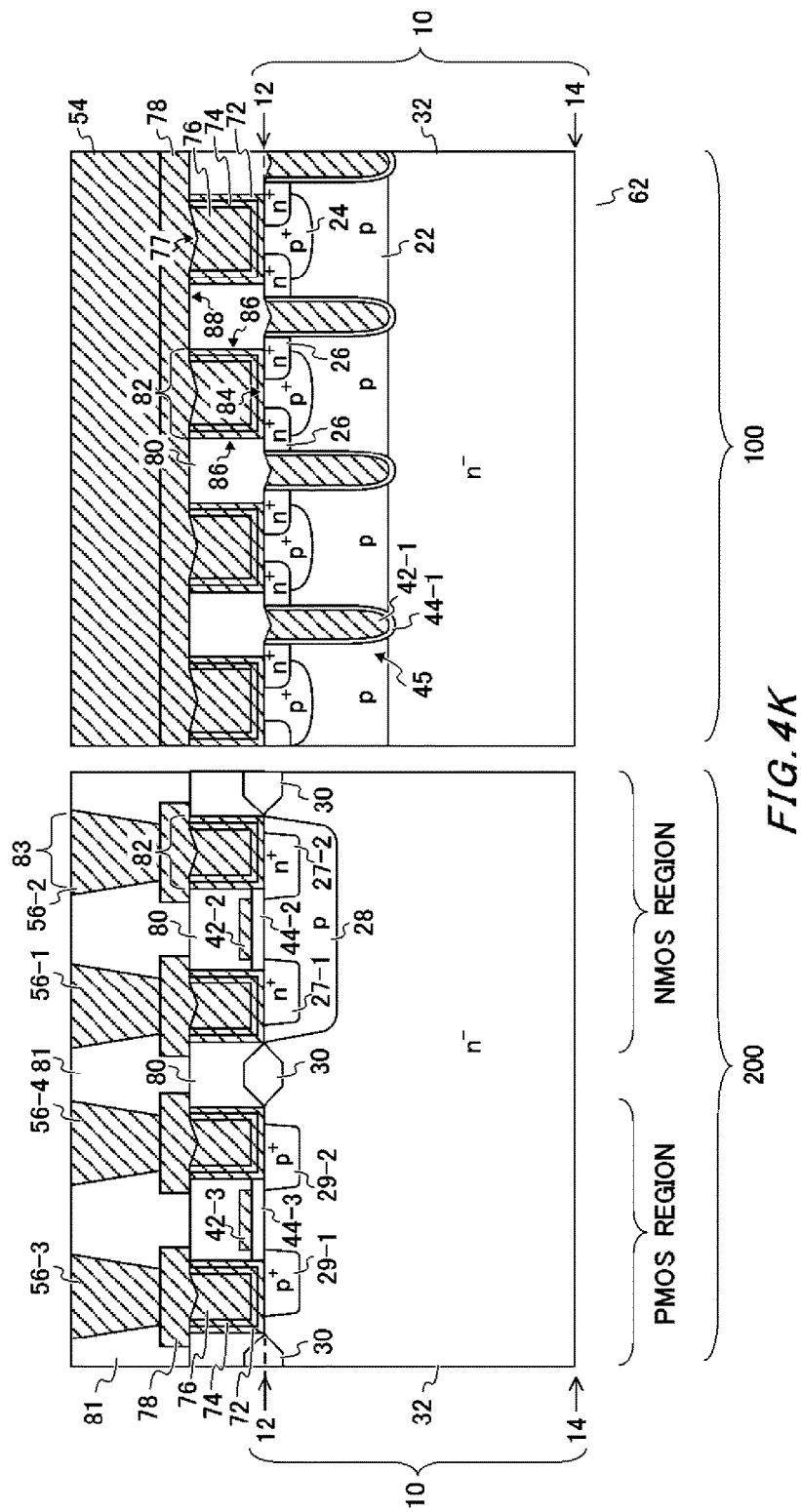
FIG. 4K is a cross-sectional view in step S70.

FIG. 4K is a cross-sectional view in step S70. In step S70, the upper electrode 54 is formed on the TiN film 78 in the power element unit 100, and formed in the opening 83 and on the insulating film 81 in the control circuit unit 200. The upper electrode 54 of the present example is an Al—Si—Cu film formed by sputtering. Then, the wiring layer 56 above and on top of the insulating film 81 in the control circuit unit 200 is appropriately removed. Because of this, the upper electrode 54 in the power element unit 100 and the wiring layer 56 inside the opening 83 in the control circuit unit 200 are formed.

Figure 4L:
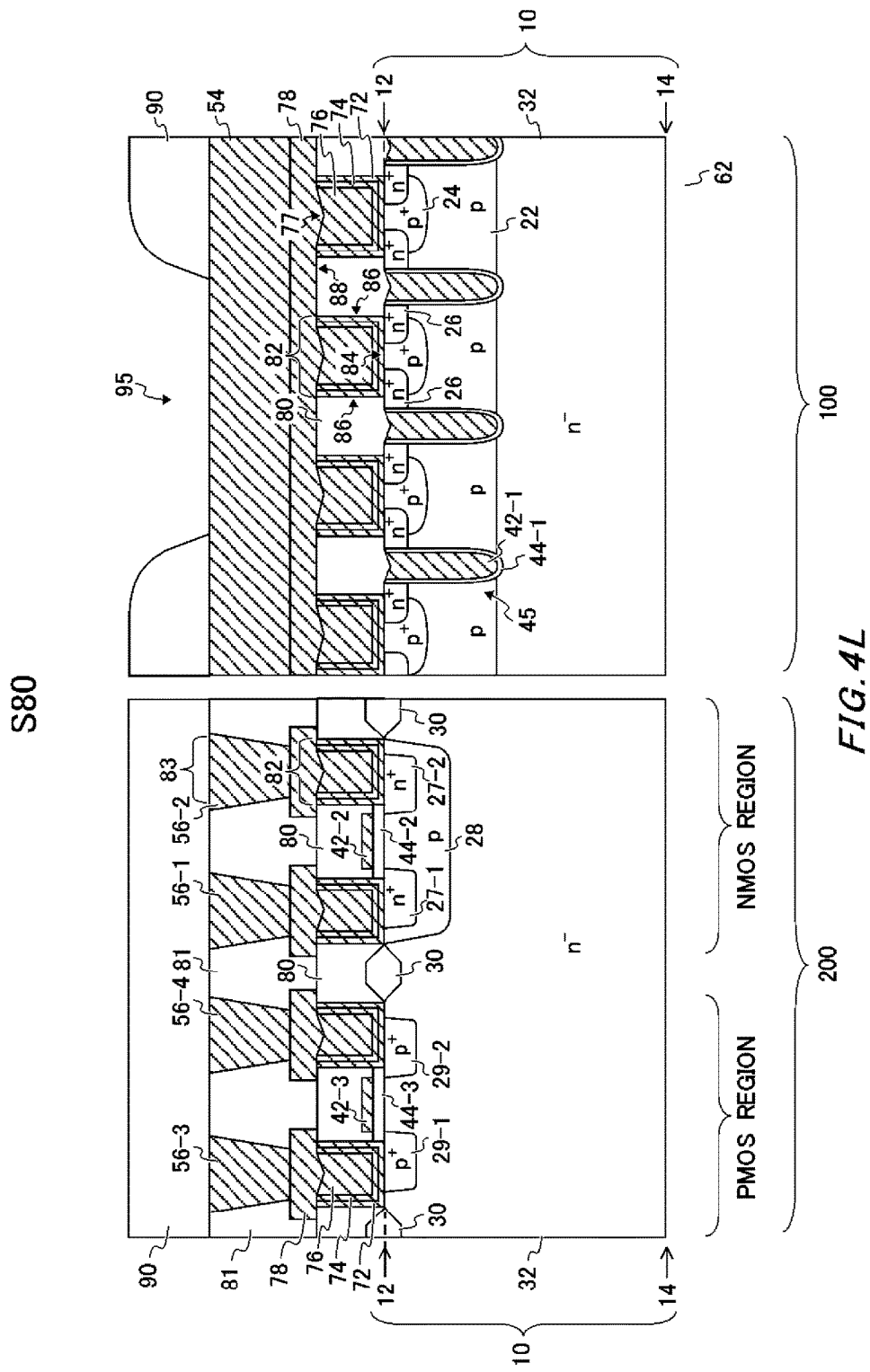
FIG. 4L is a cross-sectional view in step S80.

FIG. 4L is a cross-sectional view in step S80. In step S80, the passivation film 90 is formed. The passivation film 90 may be a polyimide film formed by coating or a silicon nitride film formed by CVD. Then, the passivation film 90 is selectively etched to provide the opening 95.

Figure 4M:
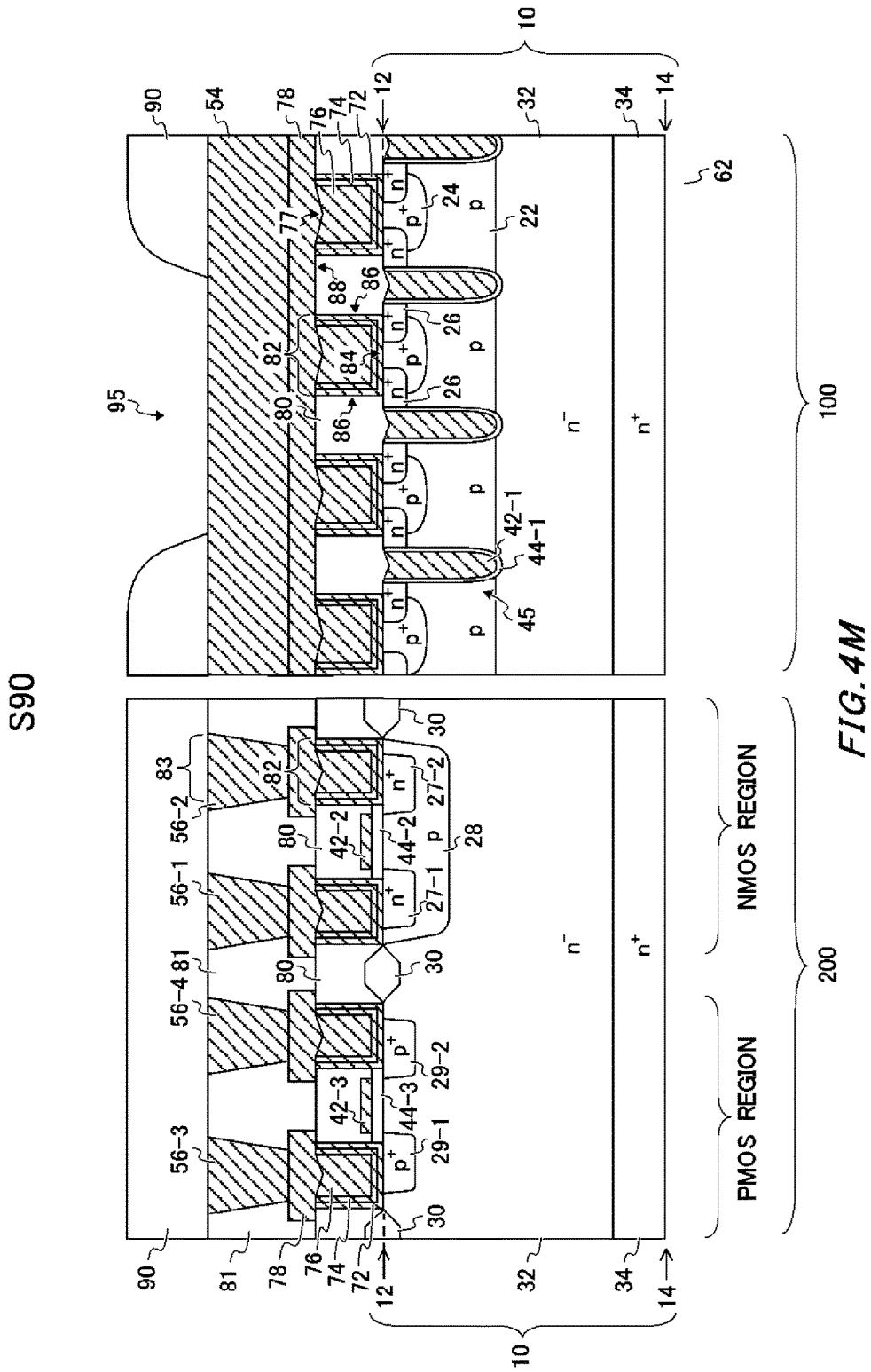
FIG. 4M is a cross-sectional view in step S90.

FIG. 4M is a cross-sectional view in step S90. In step S90, n-type impurities are ion-implanted from the back surface 14. Note that the drain region 34 may also be formed in the control circuit unit 200, and therefore n-type impurities are ion-implanted on the entire back surface 14. Then, the $n^+$-type drain region 34 is formed by performing thermal annealing.

Figure 4N:
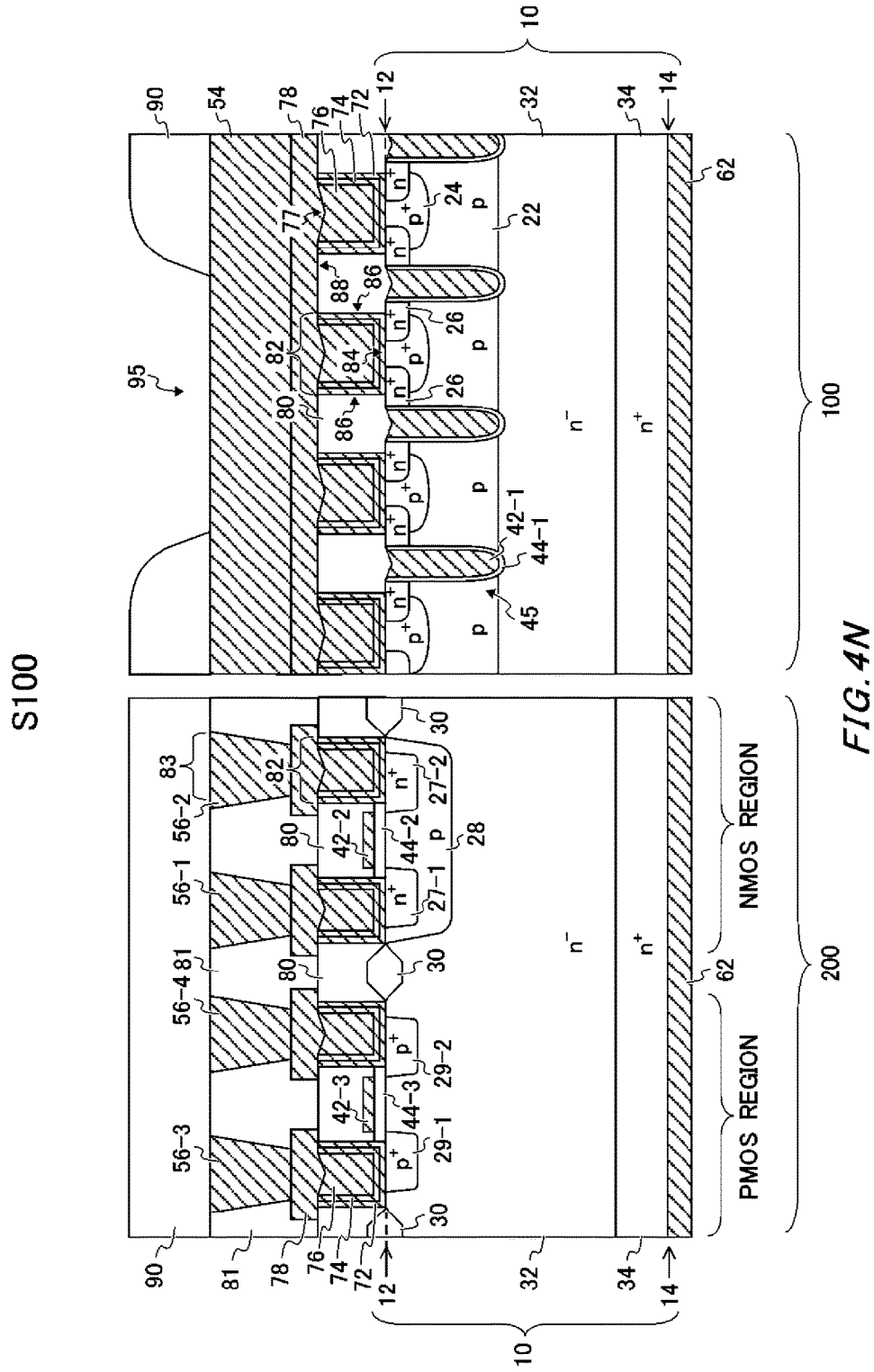
FIG. 4N is a cross-sectional view in step S100.

FIG. 4N is a cross-sectional view in step S100. In step S100, the drain electrode 62 is formed by sputtering. The drain electrode 62 may have the Ti film that directly contacts the back surface 14 and an Al film that directly contacts the Ti film. The semiconductor device 300 is thereby completed. After the semiconductor device 300 is completed, the wire 52 and the upper electrode 54 are electrically connected using the solder 53.

Figure 5:
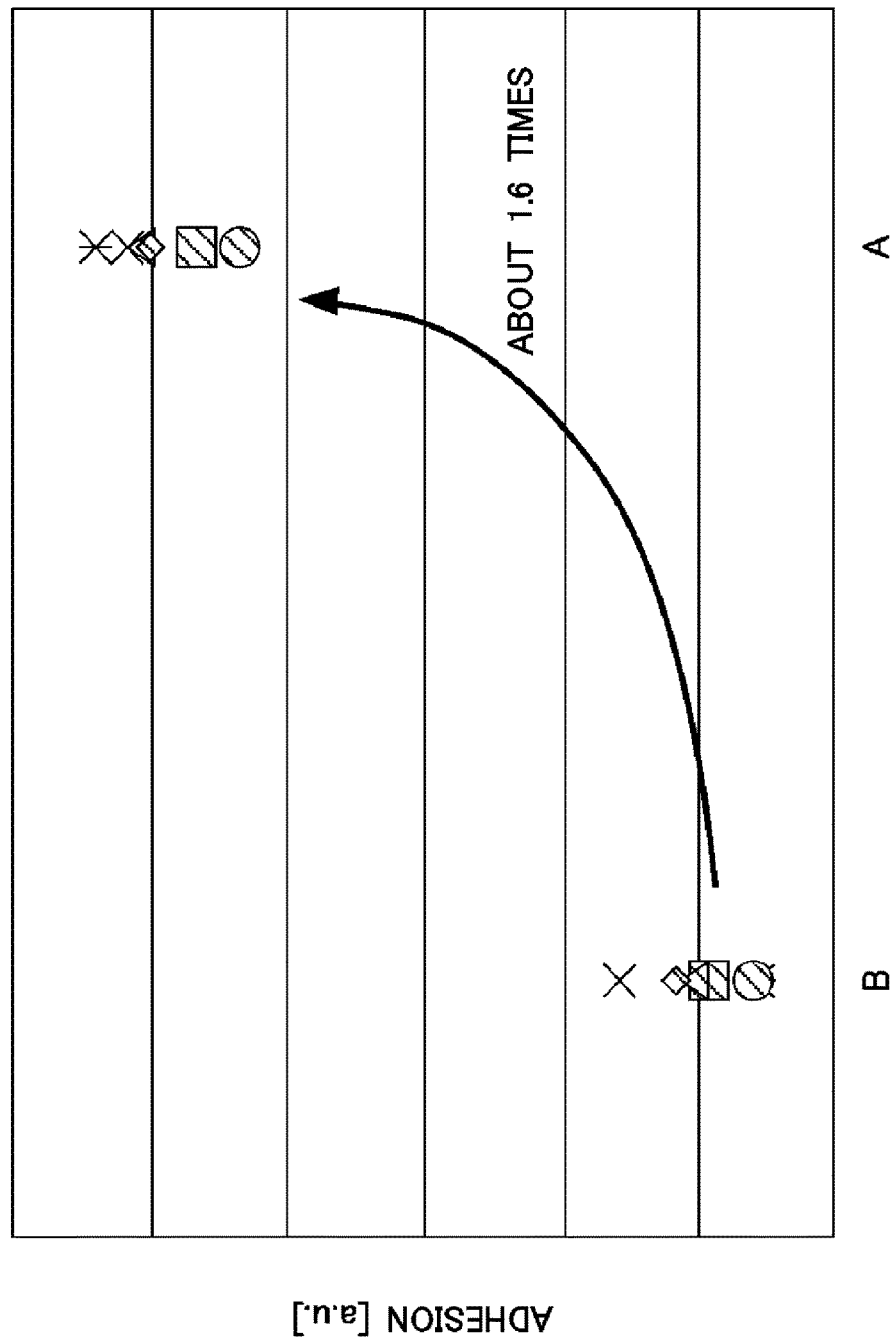
FIG. 5 is a graph showing the result of an adhesion test.

FIG. 5 is a graph showing the adhesion test result. A on the horizontal axis shows a plurality of samples of the power element unit 100 in the first embodiment. That is, A on the horizontal axis indicates a plurality of samples in which the TiN film 78 is provided on the insulating film 80. B on the horizontal axis shows a plurality of samples of the power element unit 100 in a comparison example. That is, B on the horizontal axis indicates a plurality of samples in which the Ti film is provided on the insulating film 80, and the TiN film 78 is provided on the Ti film. Sample A and Sample B are set to be the same except for the configuration on the insulating film 80. Six samples were prepared for each of Sample A and Sample B.

The vertical axis indicates an arbitrary unit of the adhesion. A load was applied to the boundary between the insulating film 80 and the TiN film 78 of Sample A and to the boundary between the insulating film 80 and the Ti film of Sample B, in the direction parallel to the plane of each of the samples, to measure the force required to peel off the TiN film of Sample A and the Ti film of Sample B. The force required for the peeling off for Sample A was about 1.6 times that for Sample B. That is, the adhesion of Sample A turned out to be 1.6 times greater than that of Sample B. In this way, in the semiconductor device 300, adhesion was increased between the insulating film 80 and the film to be provided on the upper surface thereof (TiN film 78), by eliminating the contact in the upper/lower direction between the Ti film and the insulating film 80 containing oxygen. This can increase the adhesion between the insulating film 80 and the upper electrode 54.

In some cases, stress is applied to the wire 52 and the solder 53 in bonding wires and using the device. Thus, in a Sample B with low adhesion, in order to secure operation reliability, the wire 52 and the solder 53 need to be provided outside the power element unit 100. Therefore, the chip size of the semiconductor substrate 10 of Sample B inevitably becomes larger than that of Sample A.

In contrast, in Sample A, adhesion between the insulating film 80 and the upper electrode 54 increases more than in Sample B, and therefore the wire 52 and the solder 53 can be provided right above the power element unit 100. Thus, compared to Sample B, the chip size of the semiconductor substrate 10 can be made smaller.

Cu wires are more superior to Au wires in electric and mechanical characteristics. Also, Cu wires are more inexpensive than Au wires and therefore superior in cost. However, Cu wires are harder than Au wires. Thus, in a case where the wire 52 is provided right above the power element unit 100 in Sample B, there is a possibility that the upper electrode 54 gets peeled off from the insulating film 80 before the Cu wire 52 gets disconnected when stress is applied to the Cu wire. In contrast, in Sample A, adhesion is increased between the insulating film 80 and the upper electrode 54, thereby reducing likelihood for the upper electrode 54 to be peeled off from the insulating film 80 in using the Cu wire. Thus, in the first embodiment, the superiority of Cu wires can be enjoyed.

Figure 6:
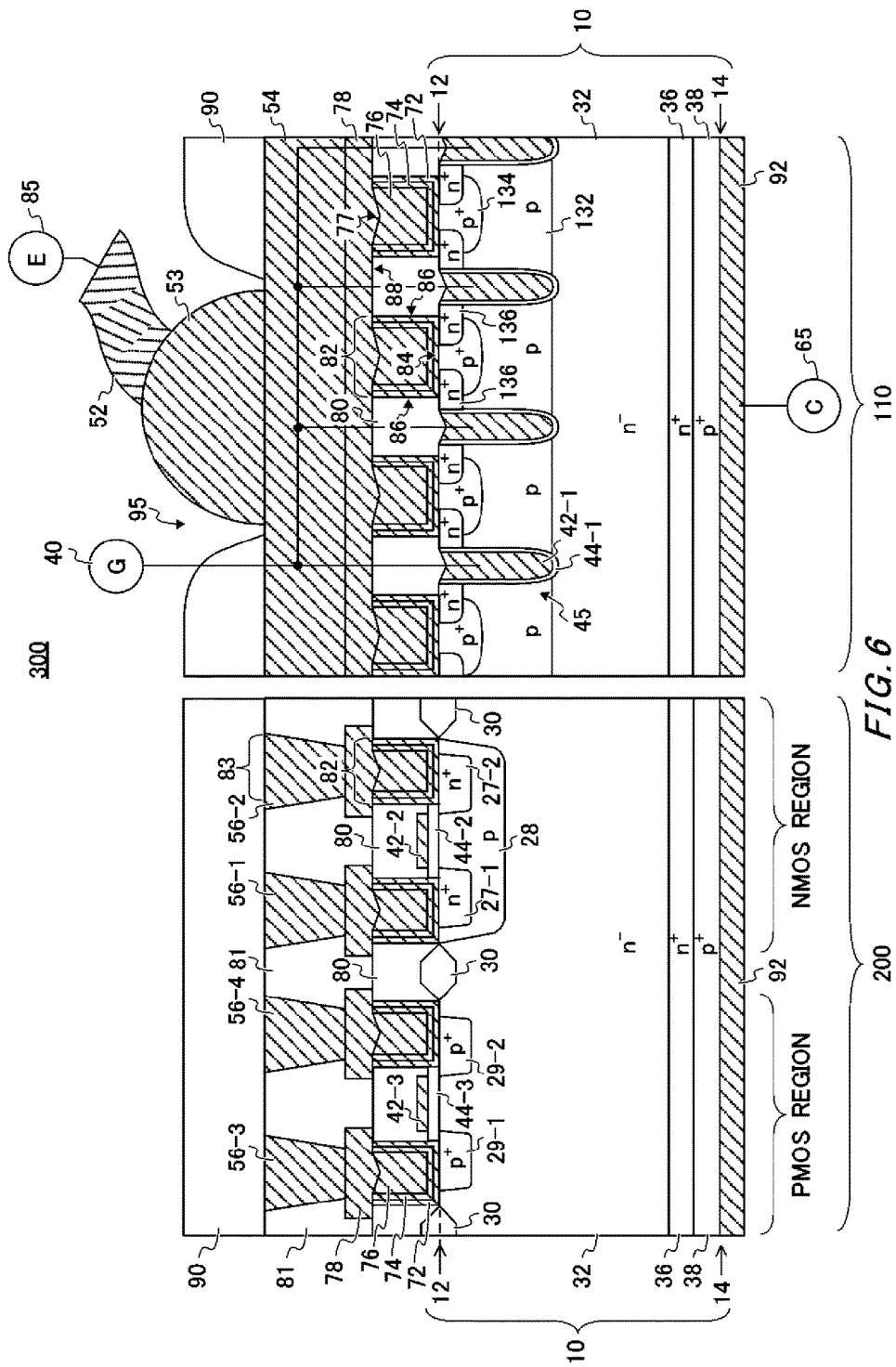
FIG. 6 is a cross-sectional view of a semiconductor device 300 in the second embodiment.

FIG. 6 is a cross-sectional view of the semiconductor device 300 in the second embodiment. The power element unit 110 of the present example is not a vertical MOSFET but a vertical IGBT. Also, the base region 22, the contact region 24, and the source region 26 in the first embodiment correspond to a base region 132, a contact region 134, and an emitter region 136, respectively. The semiconductor substrate 10 in the power element unit 110 of the present example has a collector layer 38 on the back surface 14. The collector layer 38 has a predetermined thickness in the upper direction from the back surface 14. The collector layer 38 of the present example is a p$^+$-type region. Furthermore, the semiconductor substrate 10 of the power element unit 110 of the present example has a field stop (hereinafter referred to as FS) layer 36 on the collector layer 38. The FS layer 36 has a predetermined thickness in the upper direction from the upper end of the collector layer 38. The FS layer 36 of the present example is an n$^+$-type region. Also, the power element unit 110 of the present example has a collector electrode 92 under the back surface 14. A collector portion 65 is connected to the collector electrode 92. The circled C is the collector portion 65, and the circled E is an emitter portion 85. The present example is different from the first embodiment in these points. It is the same as the first embodiment in the other points.

Figure 7:
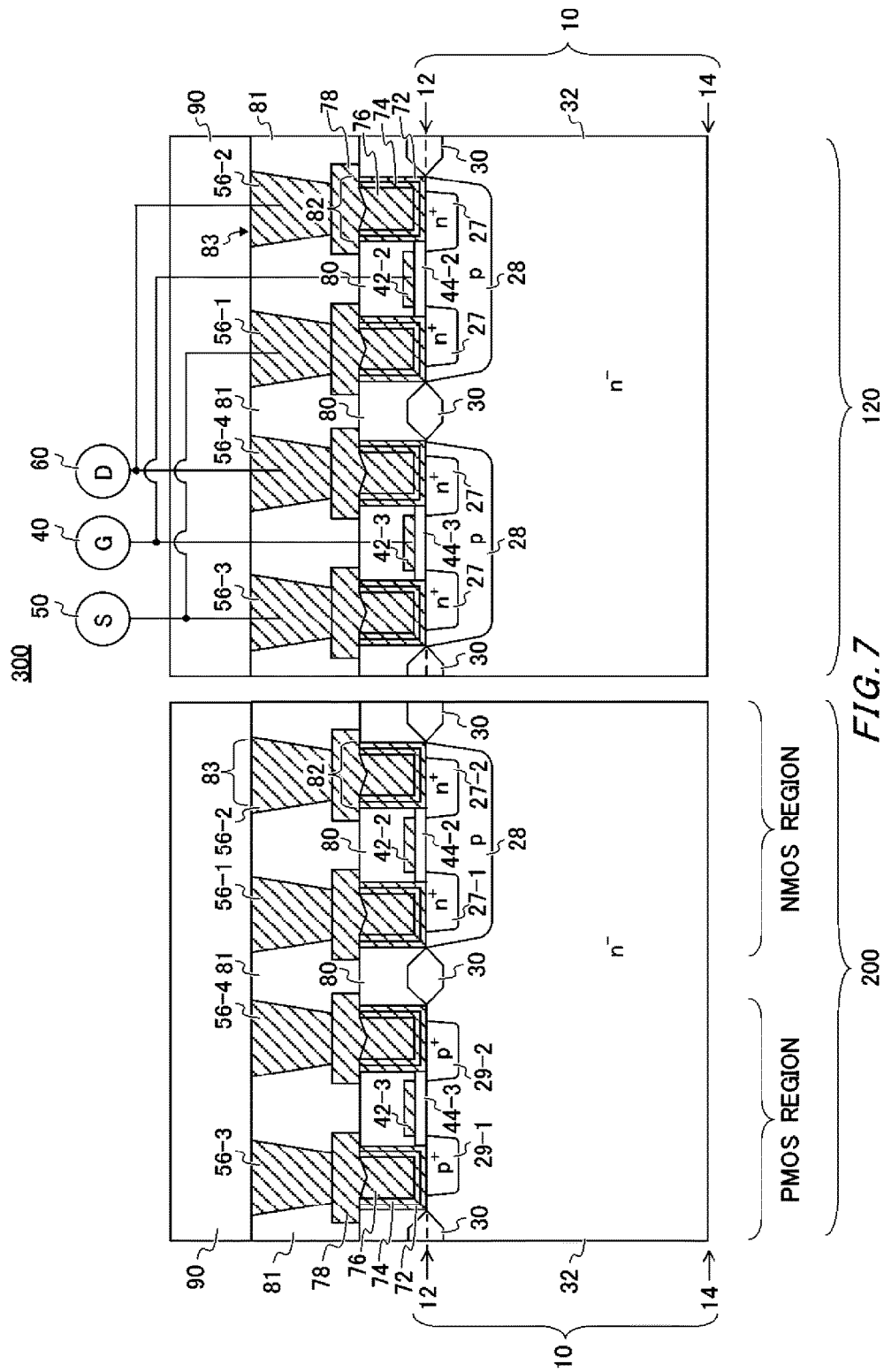
FIG. 7 is a cross-sectional view of a semiconductor device 300 in the third embodiment.

FIG. 7 is a cross-sectional view of the semiconductor device 300 in the third embodiment. The power element unit 120 of the present example is not a trench gate type vertical MOSFET but a planar gate type lateral MOSFET. In the present example, the structure of the lateral MOSFET of the power element unit 120 is the same as the structure of the NMOS region in the control circuit unit 200 of the first embodiment. In the semiconductor device 300 of the present example, the drain region 34 and the drain electrode 62 are not provided. Also, in the power element unit 120, the source portion 50 and the drain portion 60 are electrically connected respectively to the wiring layers 56-1 and 56-3 and to the wiring layers 56-2 and 56-4 through the solder 53 and the wire 52 provided in the opening 95 in the passivation film 90. The present example is different from the first embodiment in these points; however, it is the same as the first embodiment in the other points.

Figure 8:
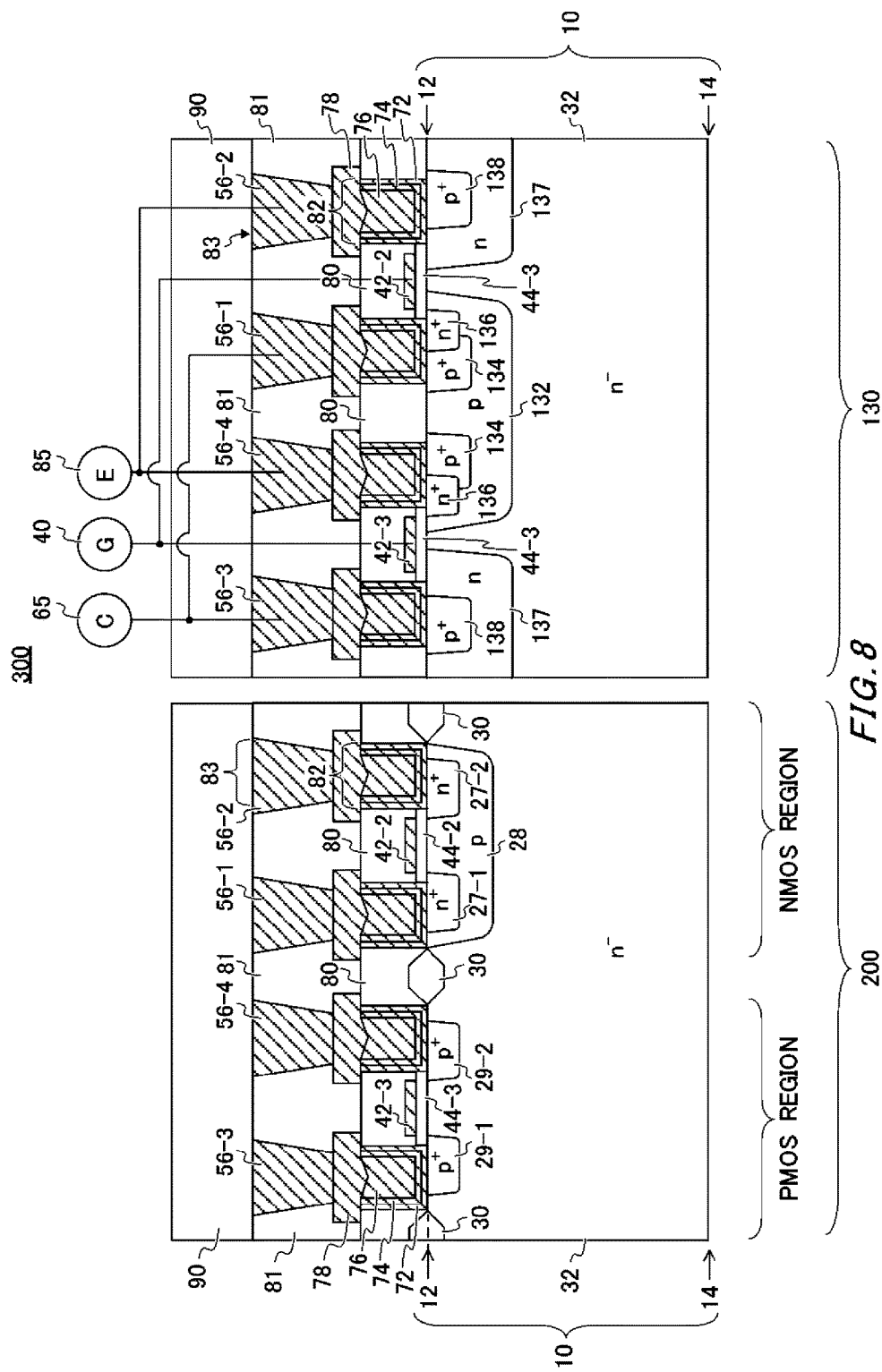
FIG. 8 is a cross-sectional view of a semiconductor device 300 in the fourth embodiment.

FIG. 8 is a cross-sectional view of the semiconductor device 300 in the fourth embodiment. A power element unit 130 of the present example is not a trench gate type vertical MOSFET but a planar gate type lateral IGBT. In the power element unit 130, the structure on the front surface 12 may be similar to that of the lateral MOSFET in the control circuit unit 200 of the first embodiment. However, it differs from the control circuit unit 200 of the first embodiment in that a pair of an emitter and a collector is provided between the gate electrodes 42-2 and 42-3, in that the isolating region 30 is not provided, and in that the drain region 34 and drain electrode 62 are not provided. Also, as in the second embodiment, in the power element unit 130, the collector portion 65 and the emitter portion 85 are electrically connected respectively to the wiring layers 56 through the solder 53 and the wire 52 provided in the openings 95 of the passivation film 90.

The semiconductor substrate 10 of the power element unit 130 of the present example has the p-type base region 132, the n$^+$-type emitter region 136, the p$^+$-type contact region 134, an n-type buffer region 137, and a p$^+$-type collector region 138. The emitter region 136 and the contact region 134 are exposed to the front surface 12. The emitter region 136 and the contact region 134 are provided in the base region 132. The buffer region 137 and the collector region 138 are exposed to the front surface 12. The collector region 138 is provided in the buffer region 137. The base region 132 and the buffer region 137 are provided to be separate from each other. The n$^-$-type drift region 32 is located between the base region 132 and the buffer region 137.

Figure 9:
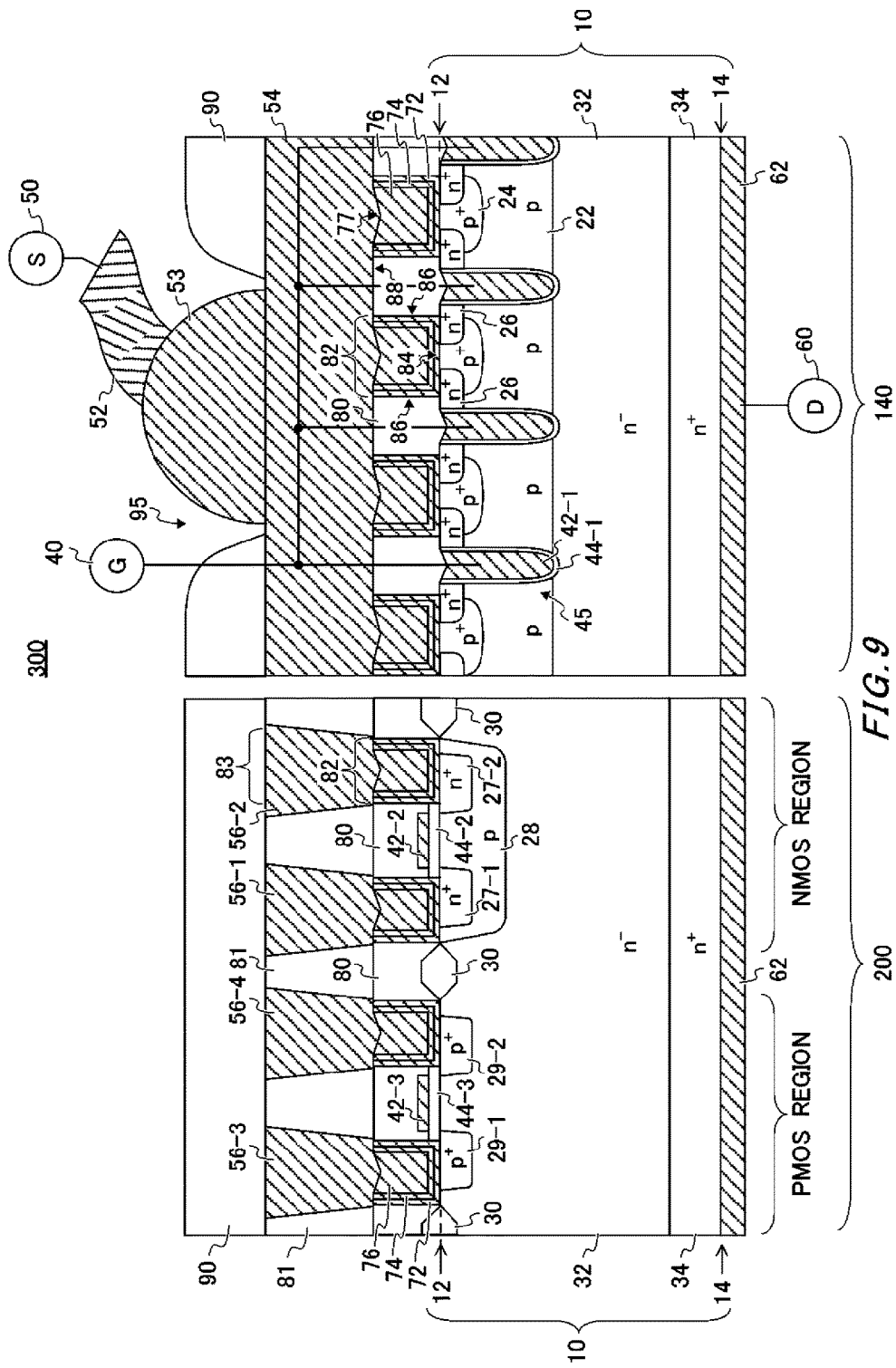
FIG. 9 is a cross-sectional view of a semiconductor device 300 in the fifth embodiment.

FIG. 9 is a cross-sectional view of the semiconductor device 300 in the fifth embodiment. In a power element unit 140 of the present example, a barrier metal is not provided between the upper surface 88 of the insulating film 80 and the upper electrode 54. The present example is different from the first embodiment in these points; however, it is the same as the first embodiment in the other points. Also in the present example, the TiO$_2$ layer is not produced on the insulating film 80, thereby preventing the upper electrode 54 from getting peeled off from the insulating film 80. This increases operation reliability of the semiconductor device 300. Note that also in the second to fourth embodiments, as in the fifth embodiment, the barrier metal may not be provided between the upper surface 88 of the insulating film 80 and the upper electrode 54.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate; 12: front surface; 14: back surface; 22: base region; 24: contact region; 26: source region; 27: n+-type well region; 28: p-type well region; 29: p+-type well region; 30: isolating region; 32: drift region; 34: drain region; 36: FS layer; 38: collector layer; 40: gate portion; 42: gate electrode; 44: gate insulating film; 45: trench portion; 50: source portion; 52: wire; 53: solder; 54: upper electrode; 56: wiring layer; 60: drain portion; 62: drain electrode; 65: collector portion; 72: Ti film; 74: TiN film; 76: W-plug; 77: upper surface; 78: TiN film; 80: insulating film; 81: insulating film; 82: opening; 83: opening; 84: bottom portion; 85: emitter portion; 86: side surface; 88: upper surface; 90: passivation film; 92: collector electrode; 95: opening; 100, 110, 120, 130, 140: power element unit; 132: base region; 134: contact region; 136: emitter region; 137: buffer region; 138: collector region; 200: control circuit unit; 300: semiconductor device

What is claimed is:

1. A semiconductor device comprising:
  a semiconductor substrate;
  an insulating film that is provided on the semiconductor substrate, has an opening through which the semiconductor substrate is exposed, and contains oxygen;
  a first barrier metal portion that is provided at least on a bottom portion of the opening and in which one or more kinds of films are laminated; and
  an upper electrode that is provided above the insulating film, and contains Al as a main component, or Cu as a main component; wherein
  a barrier metal is not provided between an upper surface of the insulating film and the upper electrode, or the semiconductor device further comprises a second barrier metal portion between the upper surface of the insulating film and the upper electrode, the second barrier metal portion having a configuration different from that of the first barrier metal portion.

2. The semiconductor device according to claim 1, wherein in the second barrier metal portion, a film that contacts the insulating film is neither a titanium film nor a titanium oxide film.

3. The semiconductor device according to claim 1, wherein the first barrier metal portion has a laminated film of a titanium film and a titanium nitride film on the titanium film, and
  the second barrier metal portion has a titanium nitride film.

4. The semiconductor device according to claim 1, further comprising a plug having tungsten in the opening in the insulating film.

5. The semiconductor device according to claim 4, wherein the second barrier metal portion is also provided between the plug and the upper electrode.

6. The semiconductor device according to claim 4, wherein the second barrier metal portion between the upper surface of the insulating film and the upper electrode and the second barrier metal portion between an upper surface of the plug and the upper electrode are continuous.

7. The semiconductor device according to claim 6, wherein the upper electrode contains silicon.

8. The semiconductor device according to claim 1, wherein provided on the semiconductor substrate are
  a power element unit that has at least the insulating film, the first barrier metal portion, the second barrier metal portion, and the upper electrode, and
  a control circuit unit that controls the power element unit.

9. The semiconductor device according to claim 1, further comprising a copper wire to be electrically connected to the upper electrode.

10. A semiconductor device manufacturing method, comprising:
  forming an insulating film containing oxygen on a semiconductor substrate;
  forming, in the insulating film, an opening that exposes the semiconductor substrate;
  forming a first barrier metal portion in which one or more kinds of films are laminated at least on a bottom portion of the opening; and
  forming an upper electrode above the insulating film, the upper electrode containing Al as a main component, or Cu as a main component, wherein
  a barrier metal is not formed between an upper surface of the insulating film and the upper electrode, or the semiconductor device manufacturing method further comprises providing a second barrier metal portion between the upper surface of the insulating film and the upper electrode, the second barrier metal portion having a configuration different from that of the first barrier metal portion.

11. The semiconductor device manufacturing method according to claim 10, further comprising forming a plug having tungsten in the opening in the insulating film after forming the first barrier metal portion and before forming the upper electrode.

12. The semiconductor device according to claim 8, wherein the second barrier metal portion is a layer that is continuous in the entire power element unit.

13. The semiconductor device according to claim 8, wherein a barrier metal portion is not provided between the upper surface of the insulating film and a layer including the upper electrode in the entire power element unit.

* * * * *